United States Patent
Bok et al.

(10) Patent No.: US 11,903,246 B2
(45) Date of Patent: Feb. 13, 2024

(54) ELECTRONIC DEVICE

(71) Applicant: SAMSUNG DISPLAY CO., LTD., Yongin-si (KR)

(72) Inventors: Seung-lyong Bok, Hwaseong-si (KR); Kicheol Kim, Yongin-si (KR); DongHo Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/059,385

(22) Filed: Nov. 28, 2022

(65) Prior Publication Data
US 2023/0086786 A1 Mar. 23, 2023

Related U.S. Application Data

(63) Continuation of application No. 16/888,416, filed on May 29, 2020, now Pat. No. 11,515,364.

(30) Foreign Application Priority Data

Jun. 12, 2019 (KR) ........................ 10-2019-0069065

(51) Int. Cl.
*G01L 1/22* (2006.01)
*H10K 59/00* (2023.01)
(Continued)

(52) U.S. Cl.
CPC .............. *H10K 59/00* (2023.02); *G01K 7/183* (2013.01); *G01L 1/2293* (2013.01);
(Continued)

(58) Field of Classification Search
CPC ...... G06F 3/0443; G06F 3/0448; G06F 3/045; G06F 3/0446; G06F 2203/04112;
(Continued)

(56) References Cited

U.S. PATENT DOCUMENTS 9,116,569 B2   8/2015 Stacy et al.
9,983,716 B2   5/2018 Yang et al.
(Continued)

FOREIGN PATENT DOCUMENTS

KR   10-2018-0000665 A   1/2018
KR   10-2019-0003902 A   1/2019
(Continued)

*Primary Examiner* — Hrayr A Sayadian
(74) *Attorney, Agent, or Firm* — Lewis Roca Rothgerber Christie LLP

(57) ABSTRACT

An electronic device includes: a base substrate including an active region, which includes a sensing region, and a peripheral region adjacent to the active region; an input sensor including a sensing insulating layer, a plurality of first sensing electrodes, a plurality of second sensing electrodes, the second sensing electrodes being spaced apart from the first sensing electrodes; and a pressure sensor including a plurality of strain sensing patterns overlapping the sensing region, and strain connection patterns connecting the strain sensing patterns to each other, wherein each of the first sensing electrodes comprises a plurality of first sensing patterns overlapping the active region, each of the second sensing electrodes comprises a plurality of second sensing patterns overlapping the active region and on a same layer as the first sensing patterns, and a plurality of second connection patterns connecting the second sensing patterns.

25 Claims, 27 Drawing Sheets

(51) Int. Cl.
  *G01K 7/18* (2006.01)
  *H10K 59/88* (2023.01)
  *H10K 59/131* (2023.01)
  *H10K 50/844* (2023.01)
  *H10K 59/122* (2023.01)

(52) U.S. Cl.
  CPC ........... *H10K 59/131* (2023.02); *H10K 59/88* (2023.02); *H10K 50/844* (2023.02); *H10K 59/122* (2023.02)

(58) Field of Classification Search
  CPC . G06F 2203/04106; G06F 2203/04111; G01L 1/205; G01L 1/2293; H10K 59/00; H10K 59/131; H10K 59/88; H10K 59/40; H10K 50/844; H10K 59/122; G01K 7/16; G01K 7/183
  USPC .................................................. 257/72, 438
  See application file for complete search history.

(56) References Cited

U.S. PATENT DOCUMENTS

| | | | |
|---|---|---|---|
| 11,515,364 B2 * | 11/2022 | Bok | ................... G01L 1/205 |
| 2017/0371471 A1 | 12/2017 | Kim et al. | |
| 2018/0329555 A1 | 11/2018 | Kim et al. | |
| 2019/0004651 A1 | 1/2019 | Hong et al. | |
| 2019/0012029 A1 | 1/2019 | Hong et al. | |
| 2020/0073495 A1 | 3/2020 | Bok et al. | |

FOREIGN PATENT DOCUMENTS

| | | | |
|---|---|---|---|
| KR | 10-2019-0006123 A | 1/2019 | |
| KR | 10-2020-0027598 A | 3/2020 | |

\* cited by examiner

ELECTRONIC DEVICE

CROSS-REFERENCE TO RELATED APPLICATIONS

This application is a continuation of U.S. patent application Ser. No. 16/888,416, filed May 29, 2020, which claims priority to and the benefit of Korean Patent Application No. 10-2019-0069065, filed Jun. 12, 2019, the entire content of both of which is incorporated herein by reference.

BACKGROUND

1. Field

Aspects of some example embodiments of the present disclosure relate to an electronic device.

2. Description of the Related Art

An electronic device may be activated in response to an electrical signal. The electronic device may include an electronic panel, which is configured to sense a variety of input signals to be applied from the outside (e.g., an external source). The electronic panel may be used independently or may be used along with a display device for displaying an image to improve a user's convenience.

The electronic device includes a variety of electrode or trace patterns, which are used to deliver electrical signals for activating the electronic device. In the case that the electrode patterns in a specific region are activated, the region may be used to display image information or to sense an external touch event.

The above information disclosed in this Background section is only for enhancement of understanding of the background and therefore the information discussed in this Background section does not necessarily constitute prior art.

SUMMARY

Aspects of some example embodiments of the present disclosure relate to an electronic device, and for example, to an electronic device with an improved pressure sensing function.

Aspects of some example embodiments of the inventive concept include an electronic device including an input sensing unit (or input sensor), in which a pressure sensing sensor is arranged.

According to some example embodiments of the inventive concept, an electronic device may include a base substrate including an active region, which includes a sensing region, and a peripheral region, which is adjacent to the active region, an input sensor including a sensing insulating layer, a plurality of first sensing electrodes, a plurality of second sensing electrodes, which are on the base substrate, the second sensing electrodes being spaced apart from the first sensing electrodes, and a pressure sensing sensor including a plurality of strain sensing patterns, which are overlapped with the sensing region, and strain connection patterns, which connect the strain sensing patterns to each other. Each of the first sensing electrodes may include a plurality of first sensing patterns, which are overlapped with the active region, and a plurality of first connection patterns, which connect the first sensing patterns with the sensing insulating layer interposed therebetween. Each of the second sensing electrodes may include a plurality of second sensing patterns, which are overlapped with the active region and are on the same layer as the first sensing patterns, and a plurality of second connection patterns, which connect the second sensing patterns. The strain sensing patterns and the first connection patterns may be on the same layer.

According to some example embodiments, each of the strain sensing patterns may be enclosed by at least one of the first and second sensing patterns, when viewed in a plan view.

According to some example embodiments, the electronic device may further include dummy patterns, which are on the same layer as the strain sensing pattern and are enclosed by at least one of the first and second sensing patterns when viewed in a plan view. The dummy patterns may be spaced apart from each of the strain sensing patterns.

According to some example embodiments, at least one of the dummy patterns may be enclosed by at least one of the strain sensing patterns.

According to some example embodiments, the electronic device may further include a temperature sensing sensor including temperature sensing patterns and temperature connection patterns connecting the temperature sensing patterns. The temperature sensing patterns may be on the same layer as the strain sensing patterns, may be enclosed by at least one of the first and second sensing patterns when viewed in a plan view, and may be spaced apart from the dummy patterns and each of the strain sensing patterns.

According to some example embodiments, each of the strain sensing patterns may include mesh lines.

According to some example embodiments, the electronic device may further include a display circuit layer and a display device layer. The display circuit layer may include a transistor, which is between the base substrate and the input sensor and includes a semiconductor pattern, and a light blocking pattern, which is on the base substrate and is overlapped with the semiconductor pattern. The display device layer includes a first electrode connected to the transistor, a second electrode opposite to the first electrode, and a light-emitting pattern between the first electrode and the second electrode. The light-emitting pattern may be spaced apart from the mesh lines, when viewed in a plan view.

According to some example embodiments, the electronic device may further include a sub-pressure sensing sensor including a sub-strain sensing pattern, which is on the same layer as the light blocking pattern, and a sub-strain sensing line, which is connected to the sub-strain sensing pattern. The sub-strain sensing pattern may overlap the strain sensing pattern.

According to some example embodiments, the electronic device may further include sub-dummy patterns, which are on the same layer as the first sensing patterns and are overlapped with the strain sensing patterns. Each of the sub-dummy patterns may be enclosed by at least one of the first and second sensing patterns, when viewed in a plan view.

According to some example embodiments, the electronic device may further include sub-dummy patterns on a same layer as the first sensing patterns. Each of the sub-dummy patterns is enclosed by at least one of the first and second sensing patterns, when viewed in a plan view. Each of the strain sensing patterns may be overlapped with at least one of the first and second sensing patterns, when viewed in a sectional view.

According to some example embodiments, the pressure sensing sensor may further include auxiliary strain sensing patterns, which are on the same layer as the first sensing patterns and are connected to the strain sensing patterns through the sensing insulating layer. The auxiliary strain sensing patterns may be enclosed by at least one of the first and second sensing patterns, when viewed in a plan view.

According to some example embodiments, the sensing region may include a home button region, which is enclosed by a border between the active region and the sensing region and has a closed-line shape. A width of each strain sensing pattern overlapped with the home button region may be larger than a width of each of the first and second sensing patterns, when measured in a specific direction in a sectional view.

According to some example embodiments, each of the strain sensing patterns may be linear.

According to some example embodiments, the pressure sensing sensor may include a first strain line, which is in the peripheral region and is connected to an end of one of the strain connection patterns, and a second strain line, which is in the peripheral region and is connected to an end of another of the strain connection patterns. The first strain line and the second strain line may be applied with signals different from each other.

According to some example embodiments of the inventive concept, an electronic device may include a sensing insulating layer, and a first conductive layer and a second conductive layer, which are spaced apart from each other with the sensing insulating layer interposed therebetween. The first conductive layer may include a pressure sensing sensor, which includes a first connection pattern, a dummy pattern enclosed by at least one of first and second sensing patterns in a plan view, a strain sensing pattern spaced apart from the first connection pattern and the dummy pattern, and a strain connection pattern connecting the strain sensing pattern. The second conductive layer may include a first sensing pattern connected to the first connection pattern through the sensing insulating layer, a second sensing pattern spaced apart from the first sensing pattern, and a second connection pattern connecting the second sensing pattern. The strain sensing pattern may be enclosed by at least one of the first sensing pattern and the second sensing pattern, when viewed in a plan view.

According to some example embodiments, the first conductive layer may be below the sensing insulating layer, and the second conductive layer may be on the sensing insulating layer.

According to some example embodiments, the second conductive layer may further include a sub-dummy pattern, which is overlapped with the strain sensing pattern and is enclosed by at least one of the first sensing pattern and the second sensing pattern when viewed in a plan view.

According to some example embodiments, the first conductive layer and the second conductive layer may include mesh lines.

According to some example embodiments, the first connection pattern, the second connection pattern, and the strain connection pattern may be spaced apart from each other, when viewed in a plan view.

According to some example embodiments, the first conductive layer may further include a temperature sensing pattern, which is enclosed by one of the first sensing pattern and the second sensing pattern when viewed in a plan view, and a temperature connection pattern, which connects the temperature sensing pattern. The temperature sensing pattern may be spaced apart from the strain sensing pattern and the dummy pattern.

BRIEF DESCRIPTION OF THE DRAWINGS

Aspects of some example embodiments will be more clearly understood from the following brief description taken in conjunction with the accompanying drawings.

The accompanying drawings represent non-limiting, example embodiments as described herein.

Figure 1A:
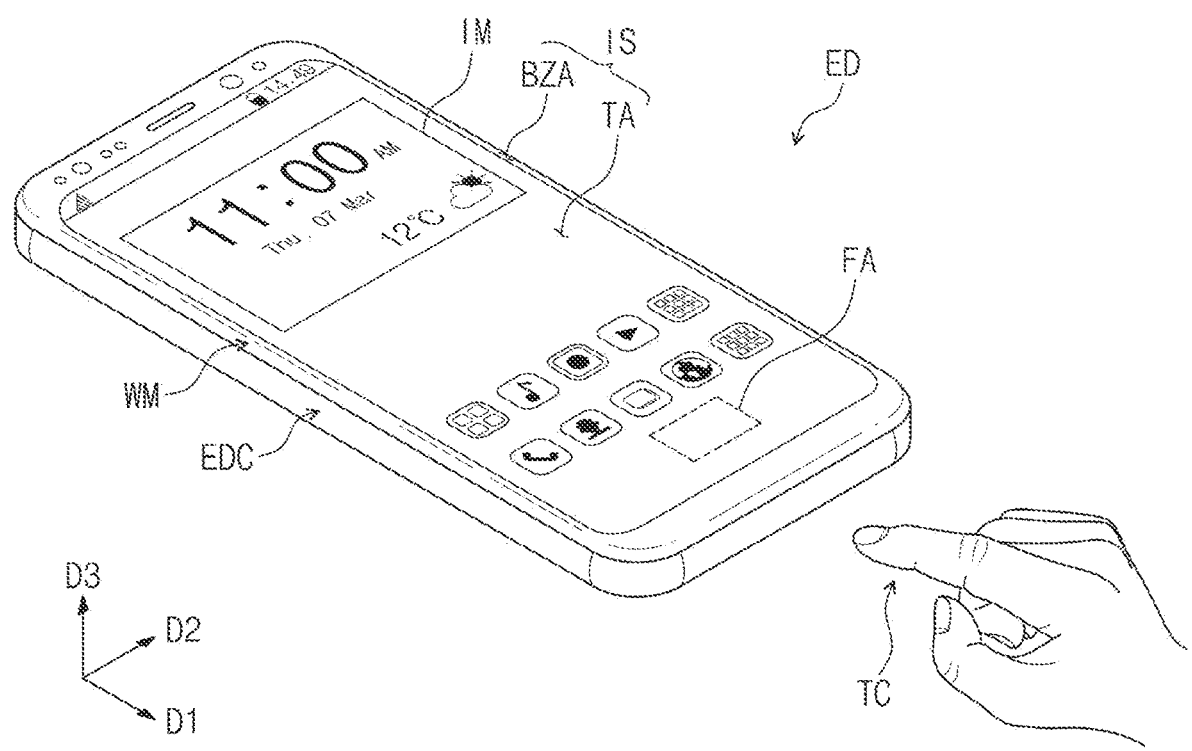
FIG. 1A is a perspective view illustrating a combined structure of an electronic device according to some example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Aspects of some example embodiments of the inventive concepts will now be described more fully with reference to the accompanying drawings, in which example embodiments are shown. Some example embodiments of the inventive concepts may, however, be embodied in many different forms and should not be construed as being limited to the embodiments set forth herein, rather, these embodiments are provided so that this disclosure will be more thorough and more complete, and will more fully convey the concepts of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein are interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Aspects of some example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
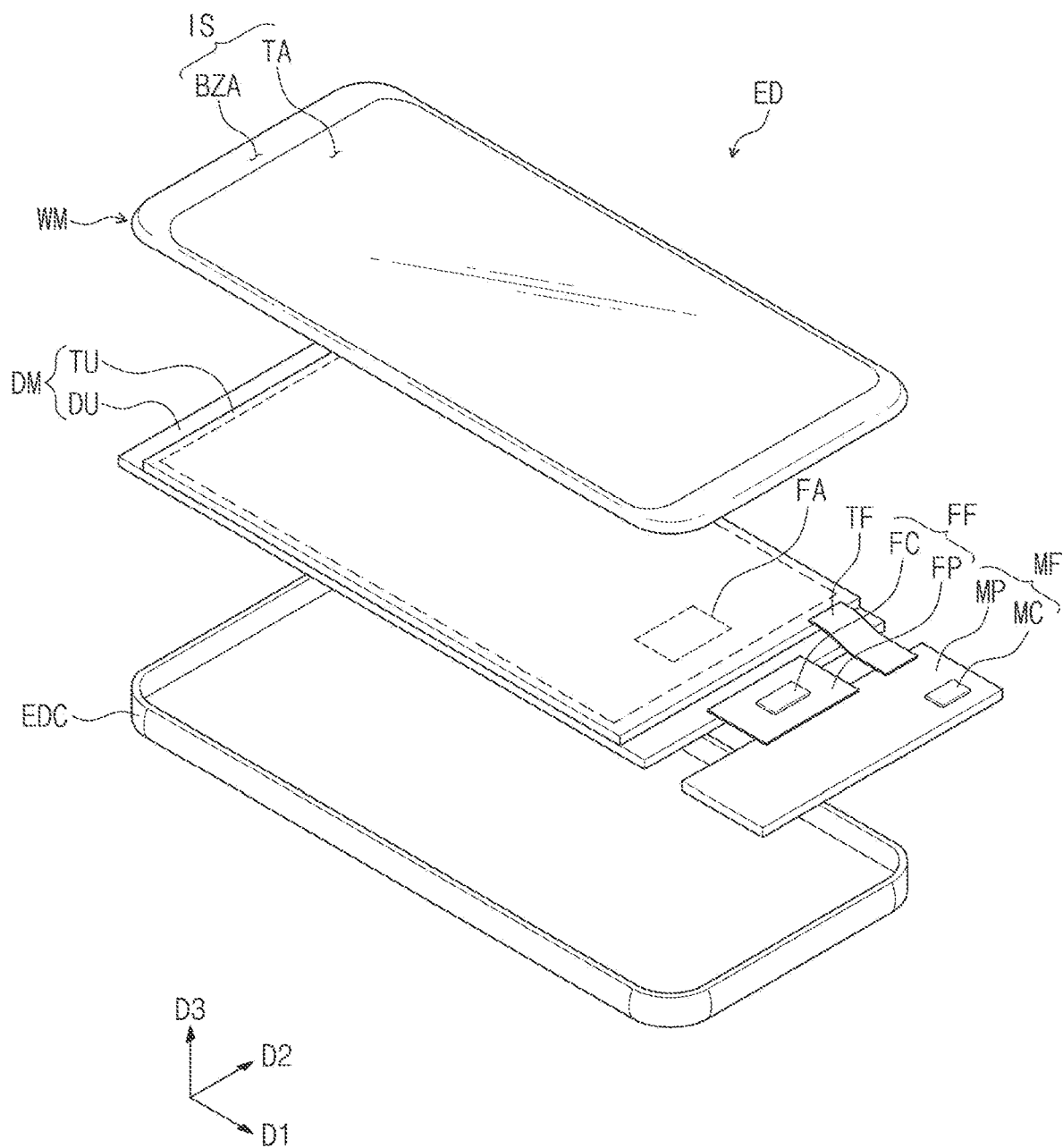
FIG. 1B is an exploded perspective view illustrating an electronic device according to some example embodiments of the inventive concept.
Figure 2:
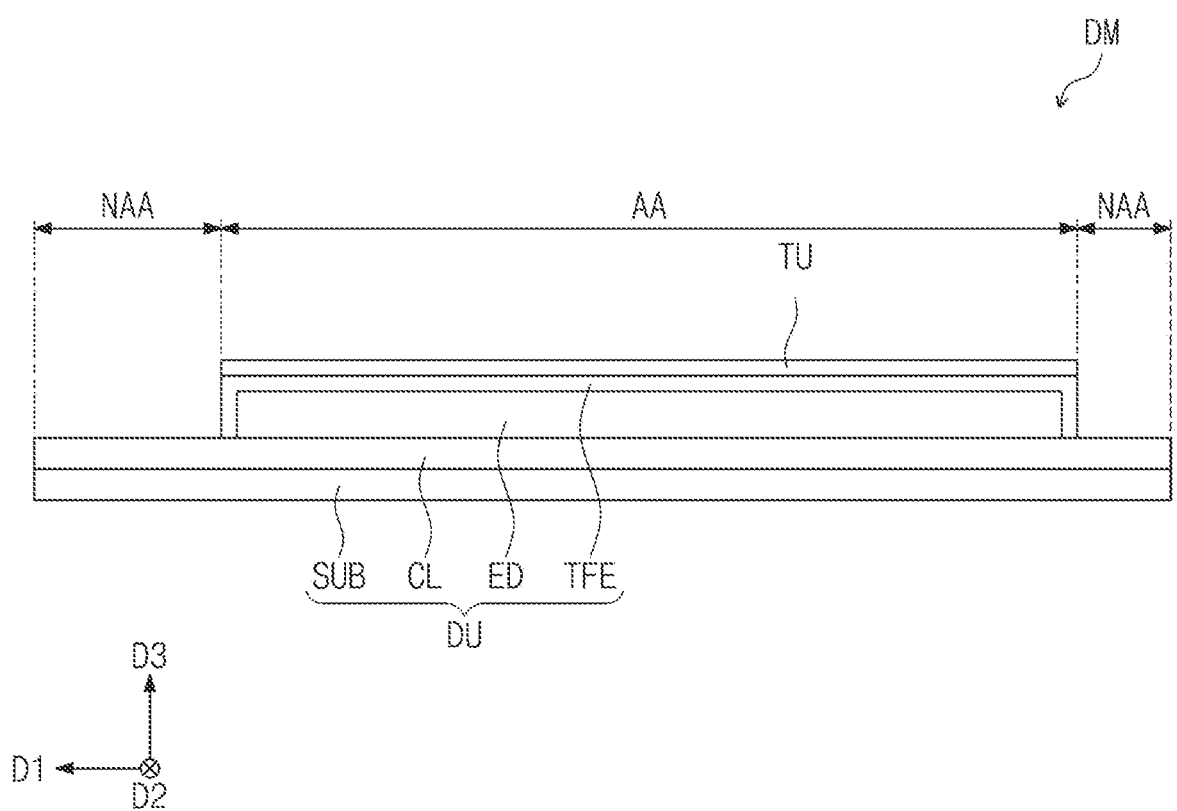
FIG. 2 is a sectional view schematically illustrating a display module according to some example embodiments of the inventive concept.
Figure 3A:
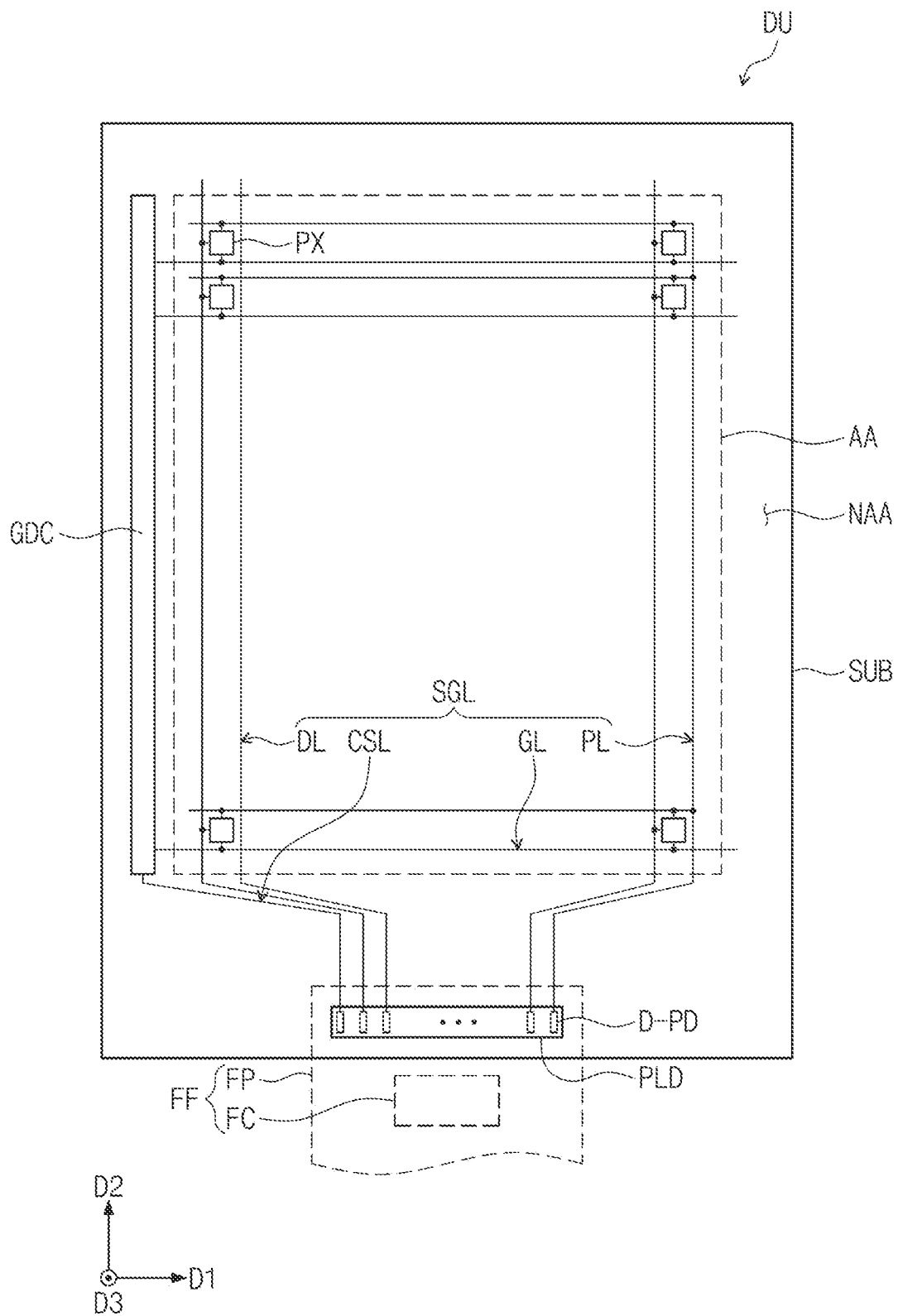
FIG. 3A is a plan view illustrating a display unit according to some example embodiments of the inventive concept.
Figure 3B:
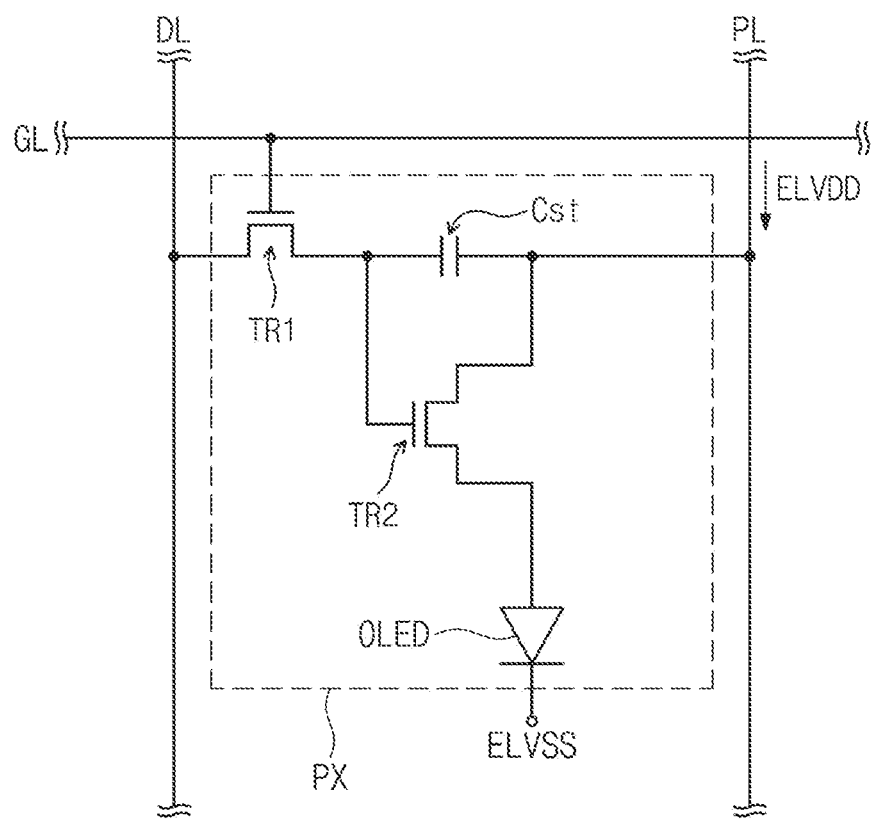
FIG. 3B is an equivalent circuit diagram illustrating a pixel according to some example embodiments of the inventive concept.

FIG. 1A is a perspective view illustrating a combined structure of an electronic device according to some example embodiments of the inventive concept. FIG. 1B is an exploded perspective view illustrating an electronic device according to some example embodiments of the inventive concept. FIG. 2 is a sectional view schematically illustrating a display module according to some example embodiments of the inventive concept. FIG. 3A is a plan view illustrating a display unit according to some example embodiments of the inventive concept. FIG. 3B is an equivalent circuit diagram illustrating a pixel according to some example embodiments of the inventive concept.

Referring to FIGS. 1A and 1B, an electronic device ED may be selectively activated by an electrical signal applied thereto. The electronic device ED may be provided in various forms. For example, the electronic device ED may be one of tablets, notebooks, computers, smart televisions, and so forth. According to some example embodiments, the electronic device ED may be a smart phone, as illustrated in FIG. 1A.

The electronic device ED may display an image IM on a display surface IS, which is parallel to a first direction D1 and a second direction D2, toward a third direction D3. The display surface IS, on which the image IM is displayed, may correspond to a front surface of the electronic device ED. The image IM may be a video image or a still (e.g., static) image. FIG. 1A illustrates still images (such as icons) as an example of the image IM.

According to some example embodiments, a front or top surface and a rear or bottom surface of each element may be distinguished, based on the display direction of the image IM. The front surface and the rear surface may be opposite to each other in the third direction D3, and a direction normal to each of the front and rear surfaces may be parallel to the third direction D3.

A separation distance between the front and rear surfaces in the third direction D3 may correspond to a thickness or height of the electronic device ED in the third direction D3. Meanwhile, directions indicated by the first to third directions D1, D2, and D3 are a relative concept, and according to some example embodiments, they may be changed to indicate other directions. Hereinafter, first to third directions may be directions indicated by the first to third directions D1, D2, and D3, respectively, and will be referenced with the same reference numbers.

The electronic device ED may sense an external input TC provided from the outside (e.g., from an external source or object). The external input TC may include various types of input signals, which are provided from the outside of the electronic device ED.

For example, the external input TC may be a touching-type input by a user's body or hand (or finger, stylus, etc.) and a non-touching-type input, such as a reduction in distance to the electronic device ED (e.g., a sensing of a close proximity of an external object) or a hovering event near (e.g., within a set or predetermined threshold distance of) the electronic device ED. In addition, the external input TC may be provided in various forms, such as force, pressure, temperature, and light.

In FIG. 1A, a sensing region FA, which is used to sense the external input TC associated with a change in at least one of pressure and temperature, is depicted by the dotted line. In FIG. 1A, the sensing region FA is illustrated to be a single rectangular region, but embodiments according to the inventive concept are not limited to this example. For example, the shape or the number of the sensing region FA may be variously changed in accordance with technical requirements, as long as a pressure sensing sensor and a temperature sensing sensor, which will be described below, are located in the sensing region FA.

The front surface of the electronic device ED may be divided into a transmission region TA and a bezel region BZA. The transmission region TA may be a region, in which the image IM is displayed. The image IM displayed in the transmission region TA may be provided to a user. According to some example embodiments, the transmission region TA is illustrated to be a rectangular shape with rounded corners. However, the shape of the transmission region TA may be variously changed, and thus embodiments according to the inventive concept are not limited to the above example or a specific embodiment.

The bezel region BZA may be located adjacent to the transmission region TA. The bezel region BZA may have a color (e.g., a set or predetermined color). The bezel region BZA may enclose the transmission region TA. Thus, the shape of the transmission region TA may be substantially defined by the bezel region BZA. However, embodiments according to the inventive concept are not limited to this example, and according to some example embodiments, the bezel region BZA may be located near only one of side regions of the transmission region TA or may be omitted. The electronic device ED may be realized as various embodiments, and embodiments according to the inventive concept are not limited to a specific embodiment.

Referring to FIGS. 1A and 1B, the electronic device ED may include a window member WM, an outer case EDC, a display module DM, a main circuit substrate MF, and flexible circuit substrates FF and TF. The display module DM may include a display unit DU, an input sensing unit (or input sensor) TU, and a pressure sensing sensor FPS (shown, e.g., in FIG. 4), which is located in the sensing region FA. The pressure sensing sensor FPS will be described in more detail below.

The window member WM may be formed of any suitable transparent material, allowing an image light to be emitted to the outside. For example, the window member WM may be formed of or include glass, sapphire, plastic, and so forth. Although the window member WM is illustrated to be a single layer, embodiments according to the inventive concept are not limited to this example, and according to some example embodiments, the window member WM may include a plurality of layers. According to some example embodiments, the bezel region BZA of the electronic device ED may substantially be a region of the window member WM, in which a material of a specific color is printed.

The outer case EDC may contain the display module DM. The outer case EDC may be coupled with the window member WM to define an outer appearance of the electronic device ED. The outer case EDC may absorb impact exerted from the outside and may prevent or reduce instances of contamination material or moisture entering the display module DM, and thus, internal elements contained in the outer case EDC may be protected from the contamination material or the moisture. According to some example embodiments, the outer case EDC may include a plurality of container members coupled to each other.

Referring to FIG. 2, the display module DM according to some example embodiments of the inventive concept may include the display unit (or display) DU and the input sensing unit TU.

The display module DM may display an image IM in response to an electrical signal applied thereto and may transmit or receive information on the external input TC. The display module DM may include an active region AA and a peripheral region NAA. The active region AA may be defined as a region, which is used to emit image light provided from the display module DM.

According to some example embodiments, the sensing region FA may be included in the active region AA. For example, the sensing region FA may be enclosed by the active region AA. Thus, according to some example embodiments, the external input TC associated with at least one of pressure and temperature may be sensed by the sensing region FA located in the active region AA.

The peripheral region NAA may be adjacent to the active region AA. For example, the peripheral region NAA may enclose the active region AA. However, embodiments according to the inventive concept are not limited to this example or a specific embodiment, and the shape of the peripheral region NAA may be variously changed. According to some example embodiments, the active region AA of the display module DM may correspond to at least a portion of the transmission region TA.

Referring to FIG. 2, the display unit DU may include a base substrate SUB, a display circuit layer CL, a display device layer EDL, and an encapsulation layer TFE.

The base substrate SUB may be a flexible substrate and may include a plastic substrate, a glass substrate, a metal substrate, or a substrate formed of an organic/inorganic composite material. According to some example embodiments, the base substrate SUB may include at least one plastic film.

The display circuit layer CL may be located on the base substrate SUB. The display circuit layer CL may include a plurality of insulating layers, a plurality of signal lines, a control circuit, and a semiconductor layer.

Figure 16A:
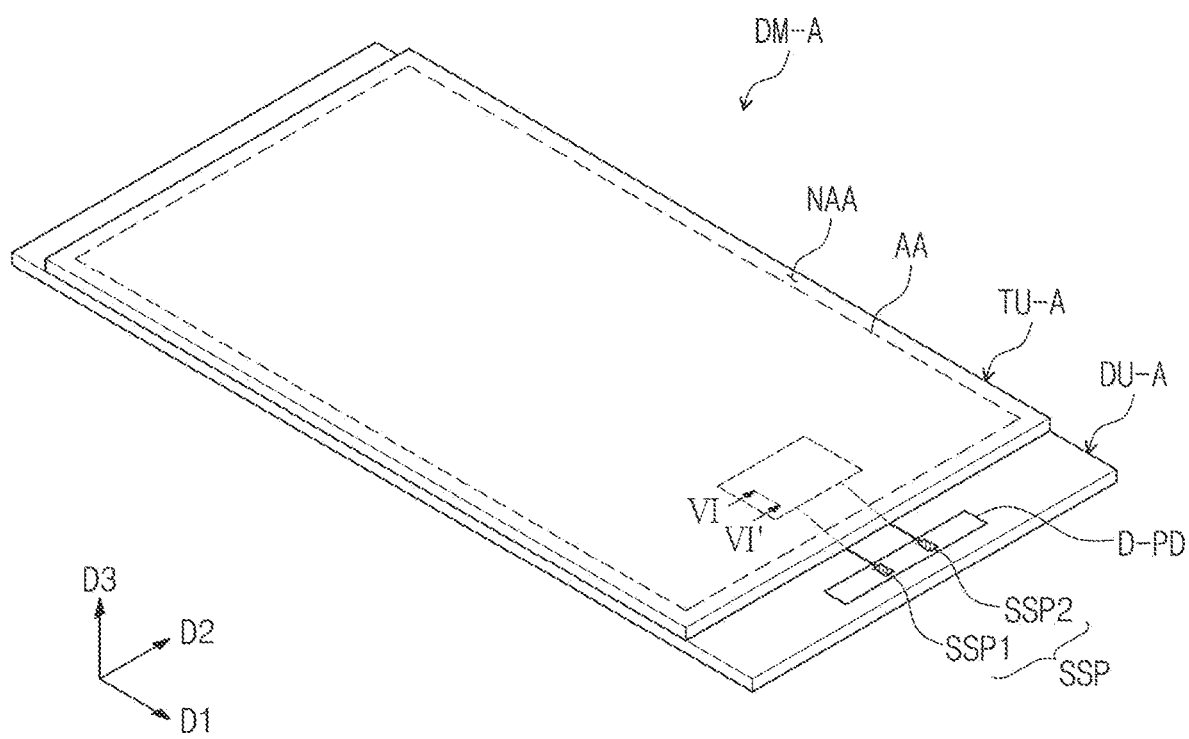
FIG. 16A is a perspective view illustrating a display module according to some example embodiments of the inventive concept.
Figure 16B:
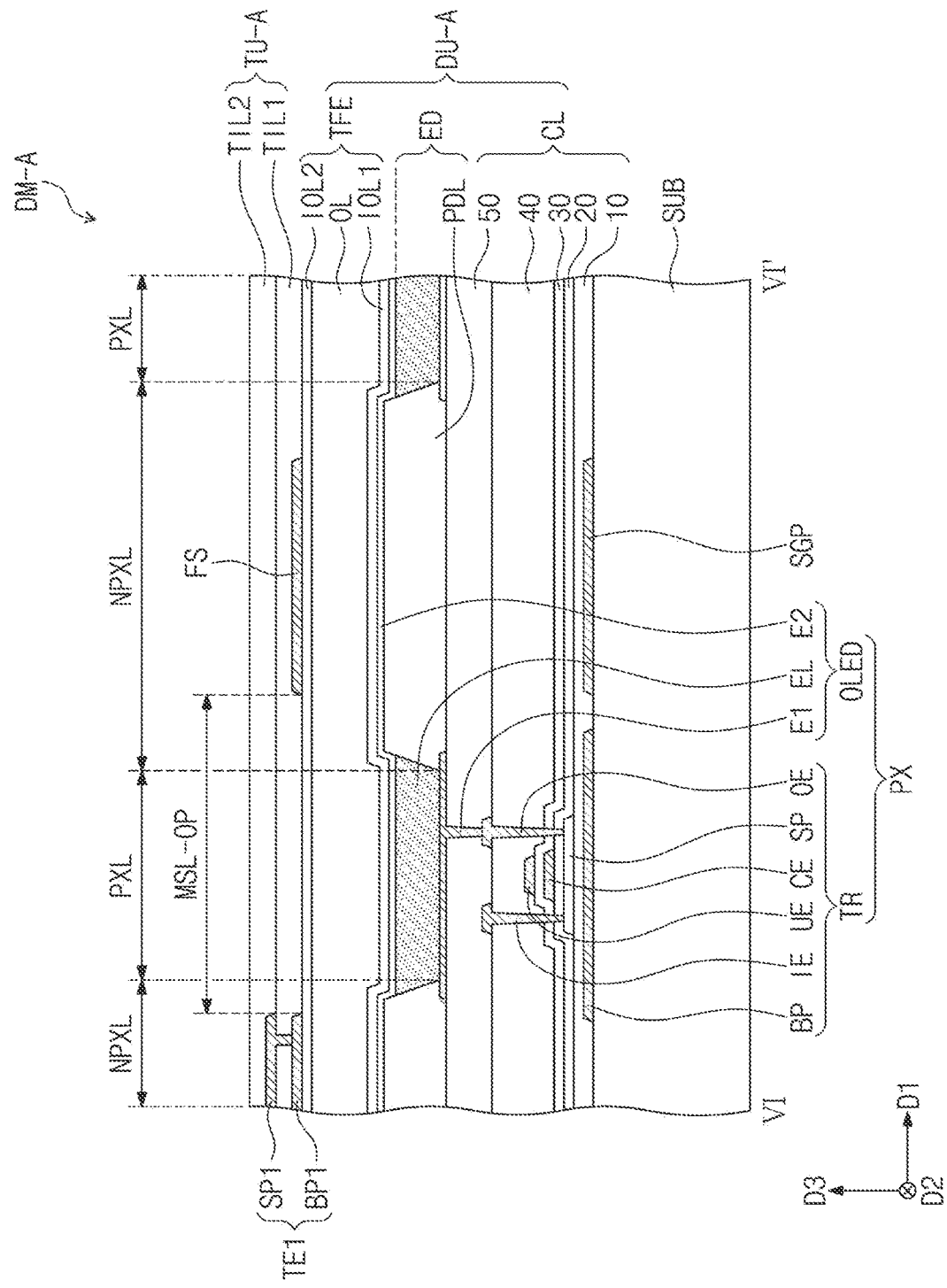
FIG. 16B is a sectional view taken along a line VI-VI' of FIG. 16A.

The display device layer EDL may include an organic light emitting device OLED (see FIG. 3B) and a pixel definition layer PDL (see FIG. 16B). The encapsulation layer TFE may seal or encapsulate the display device layer EDL.

The encapsulation layer TFE may include at least one organic layer and at least one inorganic layer. The inorganic layer may protect the display device layer EDL from moisture or oxygen. The inorganic layer may include a silicon nitride layer, a silicon oxynitride layer, a silicon oxide layer, a titanium oxide layer, an aluminum oxide layer, or the like, but embodiments according to the inventive concept are not limited to these examples.

Referring to FIGS. 3A and 3B, the display unit DU may include a driving circuit GDC, a plurality of signal lines SGL, and a plurality of pixels PX. The display unit DU may further include a pixel pad portion PLD, which is located in the peripheral region NAA and includes pixel pads D-PD connected to corresponding ones of the signal lines SGL.

The pixels PX may be located in the active region AA. Each of the pixels PX may include the organic light emitting device OLED and a pixel driving circuit connected thereto. The driving circuit GDC, the signal lines SGL, the pixel pad portion PLD, and the pixel driving circuit may be included in the display circuit layer CL shown in FIG. 2.

The driving circuit GDC may include a gate driving circuit. The gate driving circuit may generate a plurality of gate signals and then may sequentially output the gate signals to a plurality of gate lines GL to be described below. The gate driving circuit may further output other control signals to the pixel driving circuit.

The signal lines SGL may include gate lines GL, data lines DL, a power line PL, and a control signal line CSL. One of the gate lines GL may be connected to corresponding ones of the pixels PX, and one of the data lines DL may be connected to corresponding ones of the pixels PX. The power line PL may be connected to the pixels PX. The control signal line CSL may provide control signals to the gate driving circuit. The signal lines SGL may be overlapped with an active region AA and a peripheral region NAA.

The pixel pad portion PLD may be a portion, to which the main circuit substrate MF is connected, and the pixel pads D-PD of the pixel pad portion PLD may be connected to corresponding pads of the main circuit substrate MF. The pixel pads D-PD may be connected to the exposed portions of lines which are in the display circuit layer CL.

The pixel pads D-PD may be connected to corresponding ones of the pixels PX through the signal lines SGL. In addition, the driving circuit GDC may be connected to one of the pixel pads D-PD.

The pixel PX may receive a gate signal from the gate line GL and may receive a data signal from the data line DL. Furthermore, the pixel PX may receive a first power voltage ELVDD from the power line PL. The pixel PX may include a first thin film transistor TR1, a second thin film transistor TR2, a capacitor Cst, and the organic light emitting device OLED.

The first thin film transistor TR1 may output the data signal applied to the data line DL, in response to the gate signal applied to the gate line GL. The capacitor Cst may be charged to have a voltage corresponding to the data signal transmitted from the first thin film transistor TR1.

The second thin film transistor TR2 may be connected to the organic light emitting device OLED. The second thin film transistor TR2 may control a driving current flowing through the organic light emitting device OLED, depending on an amount of electric charges stored in the capacitor Cst.

The organic light emitting device OLED may include a first electrode connected to the second thin film transistor TR2, a second electrode receiving a second power voltage ELVSS, and a light-emitting pattern located between the first electrode and the second electrode. The organic light emitting device OLED according to some example embodiments of the inventive concept may include a structure, in which the first electrode, the light-emitting pattern, and the second electrode are sequentially stacked. The second power voltage ELVSS may have a voltage level lower than that of the first power voltage ELVDD.

The organic light emitting device OLED may emit light, when the second thin film transistor TR2 is in a turn-on period. The structure of the pixel PX is not limited to a specific structure and may be variously changed.

The input sensing unit TU may be directly positioned on the display unit DU. According to some example embodiments, the input sensing unit TU may be directly positioned on the encapsulation layer TFE. The input sensing unit TU may include sensing electrodes, each of which includes sensing patterns and sensing lines. The sensing electrodes and the sensing lines may have a single- or multi-layered structure.

In certain embodiments, the input sensing unit TU may be coupled to the encapsulation layer TFE by an adhesive member located on the encapsulation layer TFE, but embodiments according to the inventive concept are not limited to this example or a specific embodiment.

The main circuit substrate MF may include a base circuit substrate MP and a driving device MC. The base circuit substrate MP may be electrically connected to the display unit DU through a first flexible circuit substrate FF, and the base circuit substrate MP may be electrically connected to the input sensing unit TU through a second flexible circuit substrate TF. The base circuit substrate MP may be provided in the form a flexible printed circuit board (FPCB).

The driving device MC may include a signal control unit (or signal controller) (e.g., a timing controller). The signal control unit may receive input image signals and then may convert the input image signals to image data suitable for operations of the pixels PX. In addition, the signal control unit may also receive a variety of control signals (e.g., a vertical synchronization signal, a horizontal synchronization signal, a main clock signal, and a data enable signal) and then may output signals corresponding to the control signals.

According to some example embodiments, the driving device MC may further include circuit units (or circuit components), which are used to control the input sensing unit TU and the pressure sensing sensor FPS (e.g., see FIG. 4), but embodiments according to the inventive concept are not limited to this example or a specific embodiment.

The first flexible circuit substrate FF may be coupled to the pixel pad portion PLD of the display unit DU to electrically connect the display unit DU to the main circuit substrate MF. The first flexible circuit substrate FF may include a base film FP and a driving chip FC.

The base film FP may be flexible and may include a plurality of circuit lines. Thus, the shape of the base film FP may be variously changed, depending on the purpose and shape of the display unit DU.

The driving chip FC may be mounted on the base film FP in the form of a chip-on-film (COF). The driving chip FC may include driving devices (e.g., a data driving circuit) to drive pixels PX. Although the first flexible circuit substrate FF is illustrated to be a single element or component, embodiments according to the inventive concept are not limited to this example, and according to some example embodiments, a plurality of the first flexible circuit substrates FF coupled to the display unit DU may be provided.

The second flexible circuit substrate TF may be coupled to a portion of the input sensing unit TU to electrically connect the input sensing unit TU to the main circuit substrate MF. The second flexible circuit substrate TF may be flexible and may include a plurality of circuit lines. The second flexible circuit substrate TF may be used to transmit input sensing signals, which are provided from the main circuit substrate MF, to the input sensing unit TU.

According to some example embodiments, the electronic device ED may further include an electronic module including various functional modules, which are used to operate the electronic device ED, a power supply module supplying an electric power, which is required for an overall operation of the electronic device ED, and a bracket, which is coupled with the display module DM and/or the outer case EDC and divides an internal space of the electronic device ED.

Figure 4:
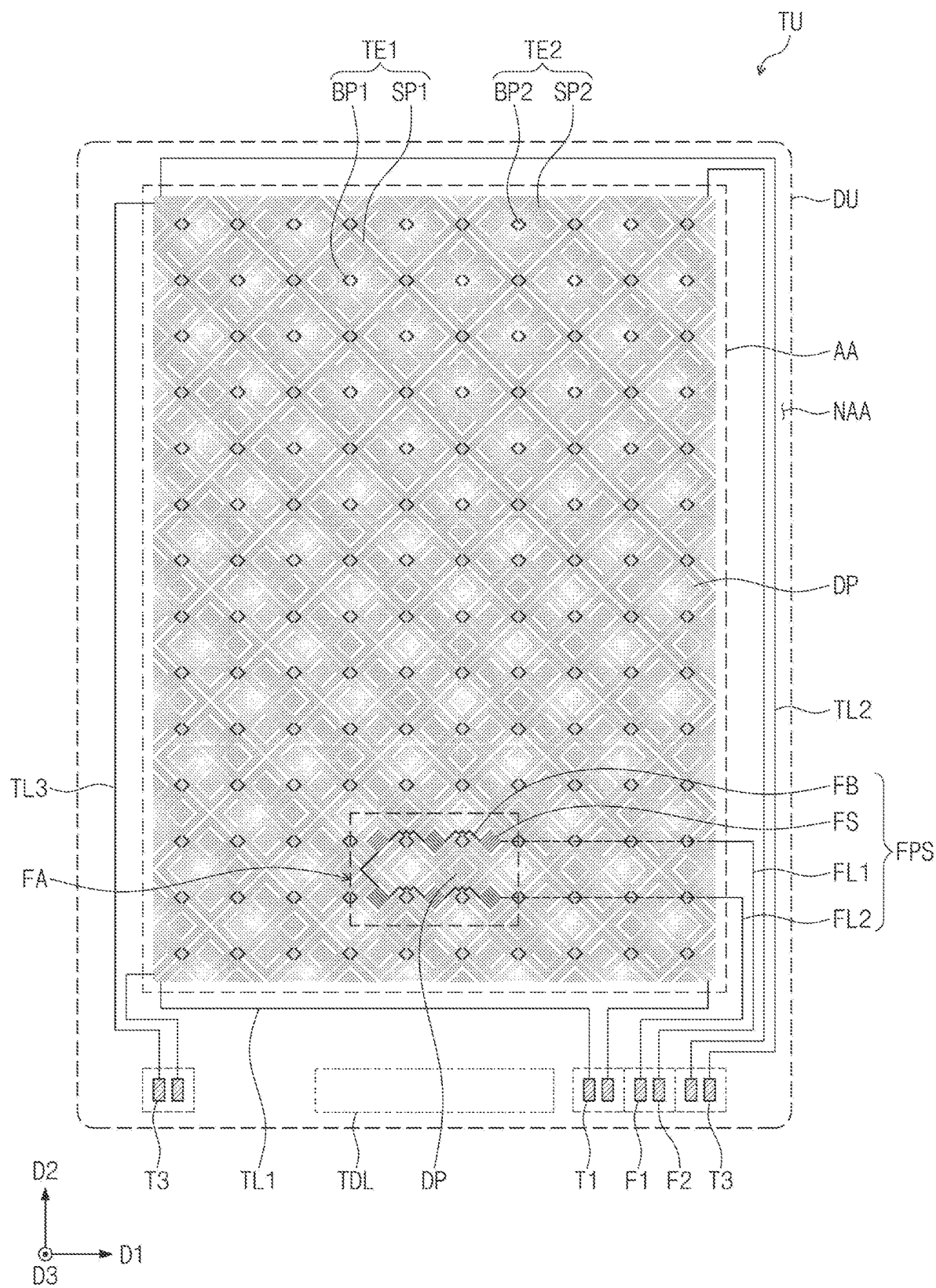
FIG. 4 is a plan view illustrating an input sensor and a pressure sensing sensor according to some example embodiments of the inventive concept.
Figure 6:
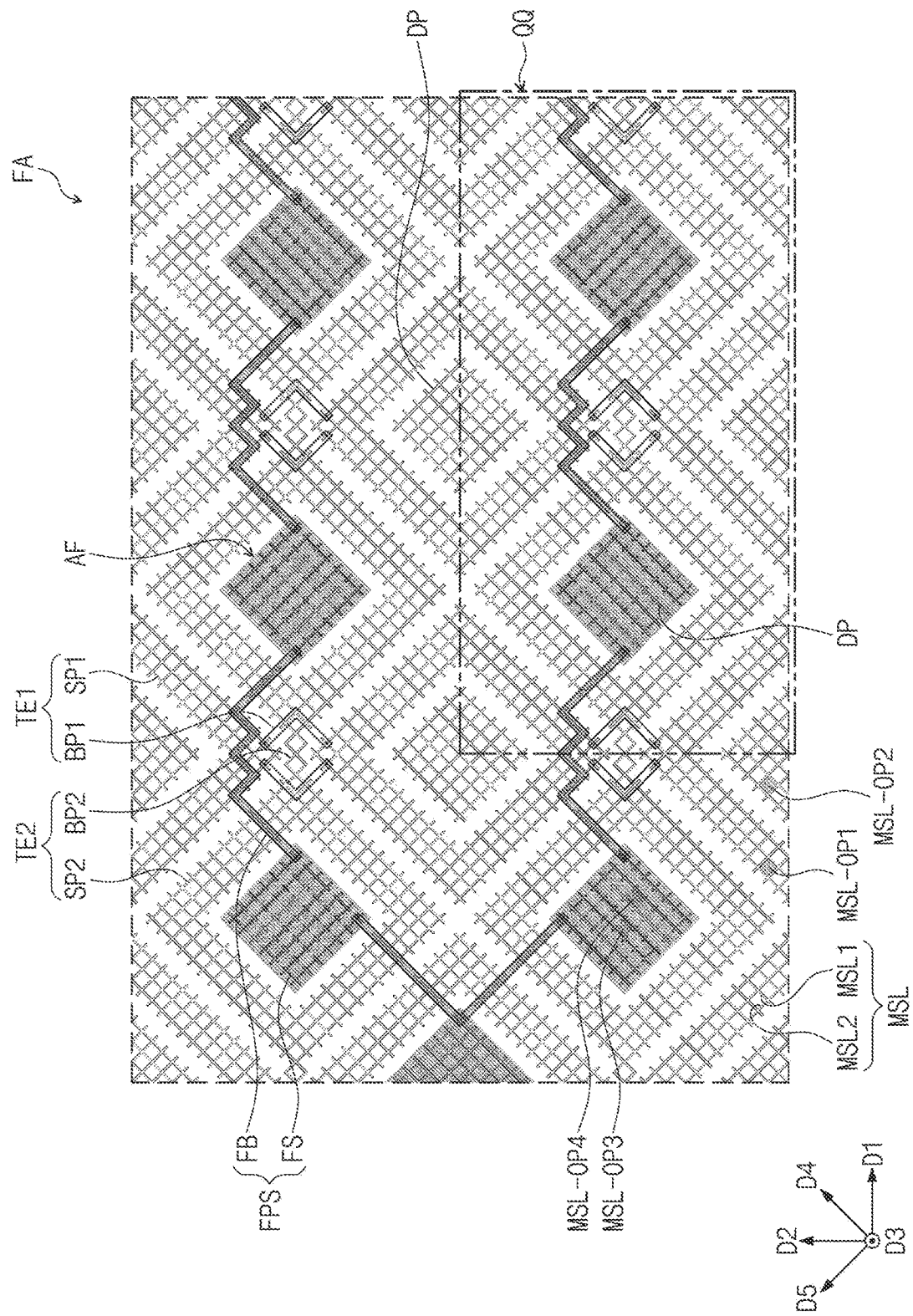
FIG. 6 is an enlarged view illustrating a sensing region according to some example embodiments of the inventive concept.
Figure 7:
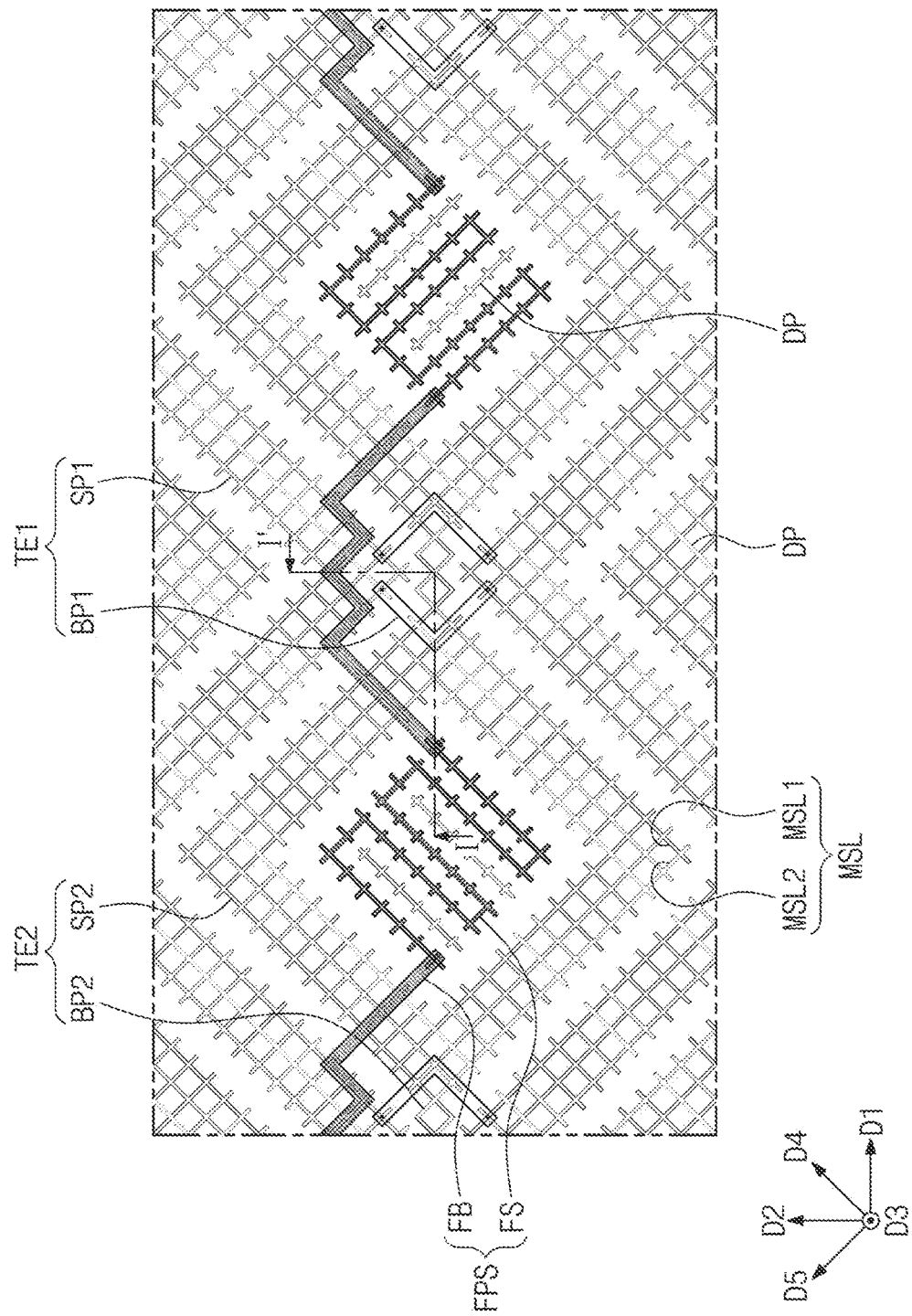
FIG. 7 is an enlarged view illustrating a region QQ' of FIG. 6.
Figure 8:
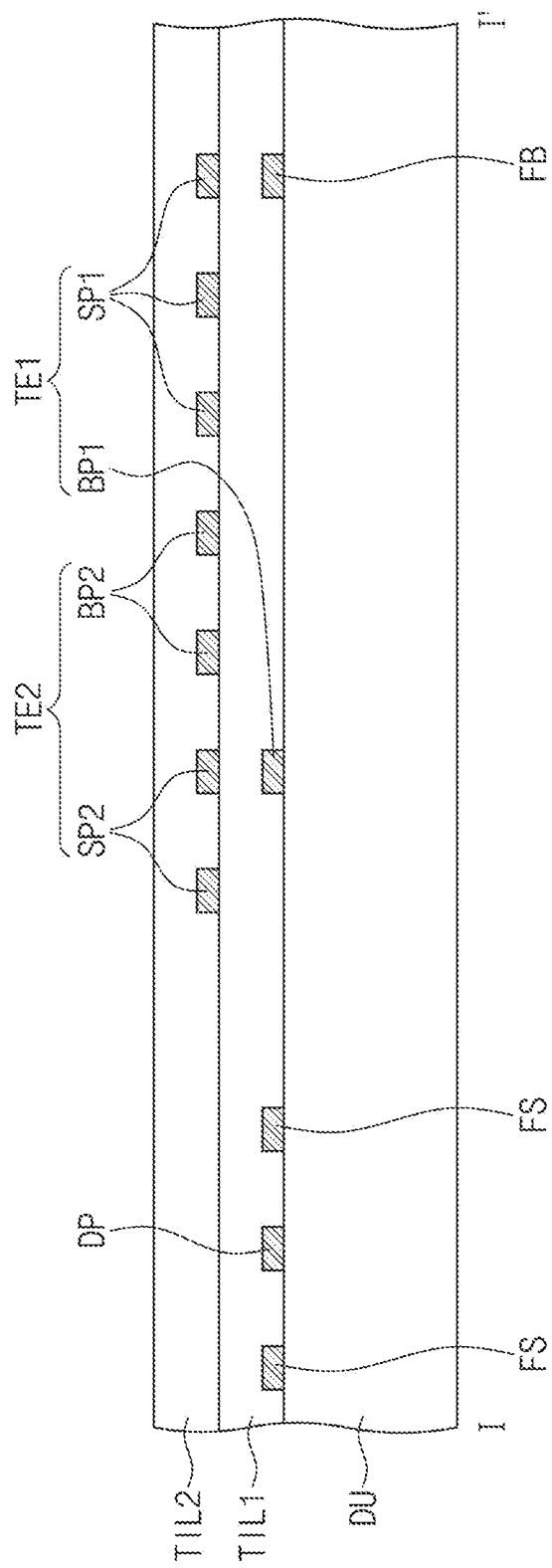
FIG. 8 is a sectional view taken along a line I-I' of FIG. 7.

FIG. 4 is a plan view illustrating an input sensing unit and a pressure sensing sensor according to some example embodiments of the inventive concept. FIGS. 5A to 5D are plan views, each of which illustrates a portion of an electronic device according to some example embodiments of the inventive concept. FIG. 6 is an enlarged view illustrating a sensing region according to some example embodiments of the inventive concept. FIG. 7 is an enlarged view illustrating a region QQ' of FIG. 6. FIG. 8 is a sectional view taken along a line I-I' of FIG. 7.

According to some example embodiments, the input sensing unit TU may be directly located on the display unit DU. Furthermore, the pressure sensing sensor FPS may be located in the input sensing unit TU. The pressure sensing sensor FPS may sense the external input TC associated with a change in pressure.

The input sensing unit TU may sense the external input TC (e.g., see FIG. 1A), thereby obtaining information on position of the external input TC. The input sensing unit TU may include a plurality of first sensing electrodes TE1, a plurality of second sensing electrodes TE2, a plurality of dummy patterns DP, a plurality of sensing lines TL1, TL2, and TL3, and a plurality of sensing pads T1, T2, and T3.

The first sensing electrodes TE1 and the second sensing electrodes TE2 may be located in the active region AA. The input sensing unit TU may obtain information on the external input TC, from a change in capacitance between the first sensing electrodes TE1 and the second sensing electrodes TE2.

The first sensing electrodes TE1 may be extended in a second direction D2 and may be arranged in the first direction D1. Each of the first sensing electrodes TE1 may include first sensing patterns SP1 and first connection patterns BP1. The second sensing electrodes TE2 may be extended in a first direction D1 and may be arranged in the second direction D2. Likewise, each of the second sensing electrodes TE2 may include second sensing patterns SP2 and second connection patterns BP2.

The first sensing patterns SP1 may be arranged in the first direction D1. The first sensing patterns SP1 may be spaced apart from each other. Each of the first sensing patterns SP1 may have a lozenge shape. However, embodiments according to the inventive concept are not limited to this example, and the shape of the first sensing patterns SP1 may be variously changed and may not be limited to a specific shape.

The first connection patterns BP1 may connect the first sensing patterns SP1, which are spaced apart from each other in the second direction D2, to each other. For example, each of the first connection patterns BP1 may be located between the first sensing patterns SP1, which are spaced apart from each other, to connect the first sensing patterns SP1.

Second sensing patterns SP2 may be arranged in the second direction D2. The second sensing patterns SP2 may be spaced apart from each other. In addition, the second sensing patterns SP2 may be spaced apart from the first sensing patterns SP1. Each of the second sensing patterns SP2 may have a lozenge shape. However, embodiments according to the inventive concept are not limited to this example. For example, according to some example embodiments, the shape of the second sensing patterns SP2 may be variously changed and is not limited to a specific shape.

Second connection patterns BP2 may connect the second sensing patterns SP2, which are spaced apart from each other in the first direction D1, to each other. For example, each of the second connection patterns BP2 may be located between the second sensing patterns SP2, which are spaced apart from each other, to connect the second sensing patterns SP2 to each other. The second connection patterns BP2 and the second sensing patterns SP2 may be connected to form a single object.

The sensing lines TL1, TL2, and TL3 may be located in and extend along the peripheral region NAA. The sensing lines TL1, TL2, and TL3 may include first sensing lines TL1, second sensing lines TL2, and third sensing lines TL3.

The first sensing lines TL1 may be connected to corresponding ones of the first sensing electrodes TE1. For example, the first sensing lines TL1 may be respectively connected to lower ends of the first sensing electrodes TE1, which are adjacent to the sensing pads T1, T2, and T3.

The second sensing lines TL2 may be connected to corresponding ones of the first sensing electrodes TE1. For example, the second sensing lines TL2 may be respectively connected to upper ends of the first sensing electrodes TE1, which are opposite to the lower ends.

The first sensing electrodes TE1 may be connected to the first sensing lines TL1 and the second sensing lines TL2. Thus, even if the first sensing electrodes TE1 are longer than the second sensing electrodes TE2, it may be possible to reduce a variation in sensitivity between regions. However, embodiments according to the inventive concept are not limited to this example or a specific embodiment, and for example, according to some example embodiments, the second sensing lines TL2 may be omitted from the input sensing unit TU.

The third sensing lines TL3 may be connected to one-side ends of corresponding ones of the second sensing electrodes TE2. For example, the third sensing lines TL3 may be connected to left ends of the second sensing electrodes TE2.

The sensing pads T1, T2, and T3 may be located in the peripheral region NAA. The sensing pads T1, T2, and T3 may include first sensing pads T1, second sensing pads T2, and third sensing pads T3. The first sensing pads T1 may be connected to corresponding ones of the first sensing lines TL1. The second sensing pads T2 may be connected to corresponding ones of the second sensing lines TL2. The first sensing pads T1 and the second sensing pads T2 may be respectively connected to the first sensing lines TL1 and the second sensing lines TL2 and may be used to provide external signals to the first sensing electrodes TE1. The third sensing pads T3 may be connected to the third sensing lines TL3, thereby being electrically connected to the second sensing electrodes TE2.

Thus, as illustrated, for example, in FIG. 4, according to some example embodiments, a plurality of sensing pads (e.g., T1, T2, and T3) may be located in the peripheral region NAA (e.g., at one side or edge of the input sensing unit TU. Corresponding sensing lines (e.g., TL1, TL2, and TL3) may be connected to the corresponding sensing pads (e.g., T1, T2, and T3) and extend along an edge of the active region AA in the peripheral region NAA and connect to corresponding sensing electrodes (e.g., TE1 and TE2). According to some example embodiments, each of the sensing pads (e.g., T1, T2, and T3) may include a plurality of sub-sensing pads, and each of the sensing lines (e.g., TL1, TL2, and TL3) may include a plurality of sub-sensing lines.

The dummy patterns DP may be spaced apart from the first sensing electrodes TE1, the second sensing electrodes TE2, and the pressure sensing sensor FPS. Thus, the dummy patterns DP may be electrically separated from the first sensing electrodes TE1, the second sensing electrodes TE2, and the pressure sensing sensor FPS.

The dummy patterns DP may be electrically floated from the first and second sensing patterns SP1 and SP2. When viewed in a plan view, each of the dummy patterns DP may be enclosed by at least one of the first and second sensing patterns SP1 and SP2. For example, each of the first and second sensing patterns SP1 and SP2 may have a lozenge shape whose center region is an empty region. Here, the dummy patterns DP may be located in the empty regions and may be electrically separated from the first and second sensing patterns SP1 and SP2.

Because the dummy patterns DP are located in the empty regions formed in the first and second sensing patterns SP1 and SP2, it may be possible to prevent the first and second sensing patterns SP1 and SP2 from being recognized by an external user. In addition, the dummy patterns DP may prevent a parasitic capacitance from being formed between the first and second sensing patterns SP1 and SP2 and the electrodes in the organic light emitting device OLED (e.g., see FIG. 3B). That is, because the dummy patterns DP are provided, it may be possible to realize the input sensing unit TU with improved reliability.

According to some example embodiments, the pressure sensing sensor FPS may be located in the input sensing unit TU. The pressure sensing sensor FPS may sense the external input TC (e.g., see FIG. 1A), which is associated with a change in resistance caused by pressure. The pressure sensing sensor FPS may include strain sensing patterns FS, strain connection patterns FB, and strain lines FL1 and FL2.

The strain sensing patterns FS may be located in the sensing region FA. The strain sensing patterns FS may be spaced apart from each other. In addition, the strain sensing patterns FS may be spaced apart from the first sensing electrodes TE1, the second sensing electrodes TE2, and the dummy patterns DP.

FIG. 4 illustrates an example, in which the strain sensing patterns FS are spaced apart from each other and are arranged to form two rows and three columns in the sensing region FA. In FIG. 4, the strain sensing patterns FS are depicted with shading patterns different from the first sensing patterns SP1, the second sensing patterns SP2, and the dummy patterns DP.

According to some example embodiments, when viewed in a plan view, each of the strain sensing patterns FS may be enclosed by at least one of the first and second sensing patterns SP1 and SP2. In addition, the strain sensing patterns FS may be spaced apart from the dummy patterns DP.

The strain sensing patterns FS may be electrically floated from the first and second sensing patterns SP1 and SP2. For example, each of the first and second sensing patterns SP1 and SP2 may have a lozenge shape whose center region is an empty region. Here, the strain sensing patterns FS may be located in the empty regions, respectively, and may be electrically separated from the first and second sensing patterns SP1 and SP2.

The strain sensing patterns FS may have the same arrangement as the dummy patterns DP. In other words, when viewed in a plan view, each of the strain sensing patterns FS may be enclosed by at least one of the first and second sensing patterns SP1 and SP2, and each of the dummy patterns DP may be enclosed by others of the first and second sensing patterns SP1 and SP2, which do not enclose the strain sensing patterns FS.

Accordingly, the strain sensing patterns FS may have the same function as the dummy patterns DP, in aspects of visibility. Because the strain sensing patterns FS are arranged in a similar manner to the dummy patterns DP, it may be possible to prevent the first and second sensing patterns SP1 and SP2 from being recognized by an external user.

The strain connection patterns FB may connect the strain sensing patterns FS, which are spaced apart from each other in the first direction D1 and in second direction D2, to each other. For example, each of the strain connection patterns FB may be located between the strain sensing patterns FS, which are spaced apart from each other, to connect the strain sensing patterns FS to each other. The strain connection patterns FB may be spaced apart from the first connection patterns BP1 and the second connection patterns BP2.

The strain connection patterns FB, which are extended from the sensing region FA to the active region AA (i.e., in the first direction D1), are depicted by the dotted lines.

The strain lines FL1 and FL2 may be located in the peripheral region NAA. The strain lines FL1 and FL2 may include a first strain line FL1 and a second strain line FL2. The first strain line FL1 may be connected to an end of the pressure sensing sensor FPS, and the second strain line FL2 may be connected to an opposite end of the pressure sensing sensor FPS. Thus, the first strain line FL1 and the second strain line FL2 may be connected to different ones of the strain connection patterns FB.

Strain pads F1 and F2 may include a first strain pad F1 and a second strain pad F2. The first strain pad F1 may be connected to the first strain line FL1, and the second strain pad F2 may be connected to the second strain line FL2. The strain pads F1 and F2 may be coupled to the second flexible circuit substrate TF shown in FIG. 1B.

Accordingly, one of two opposite ends of the pressure sensing sensor FPS may be applied with a driving signal transferred from the driving device MC (e.g., see FIG. 1B), and the other may transfer measurement data, which are obtained from a change in resistance caused by pressure, to the main circuit substrate MF.

The electronic device ED (e.g., see FIG. 1A) according to some example embodiments of the inventive concept may include a plurality of conductive layers CL-1 and CL-2 and a plurality of sensing insulating layers TIL1 and TIL2. In FIGS. 5A to 5D, the input sensing unit TU and the pressure sensing sensor FPS are illustrated for each layer, based on the sensing insulating layers TIL1 and TIL2. Elements included in the conductive layers CL-1 and CL-2 may be elements of the input sensing unit TU and the pressure sensing sensor FPS. According to some example embodiments, the sensing insulating layers TIL1 and TIL2 may be elements included in the input sensing unit TU.

Figure 5A:
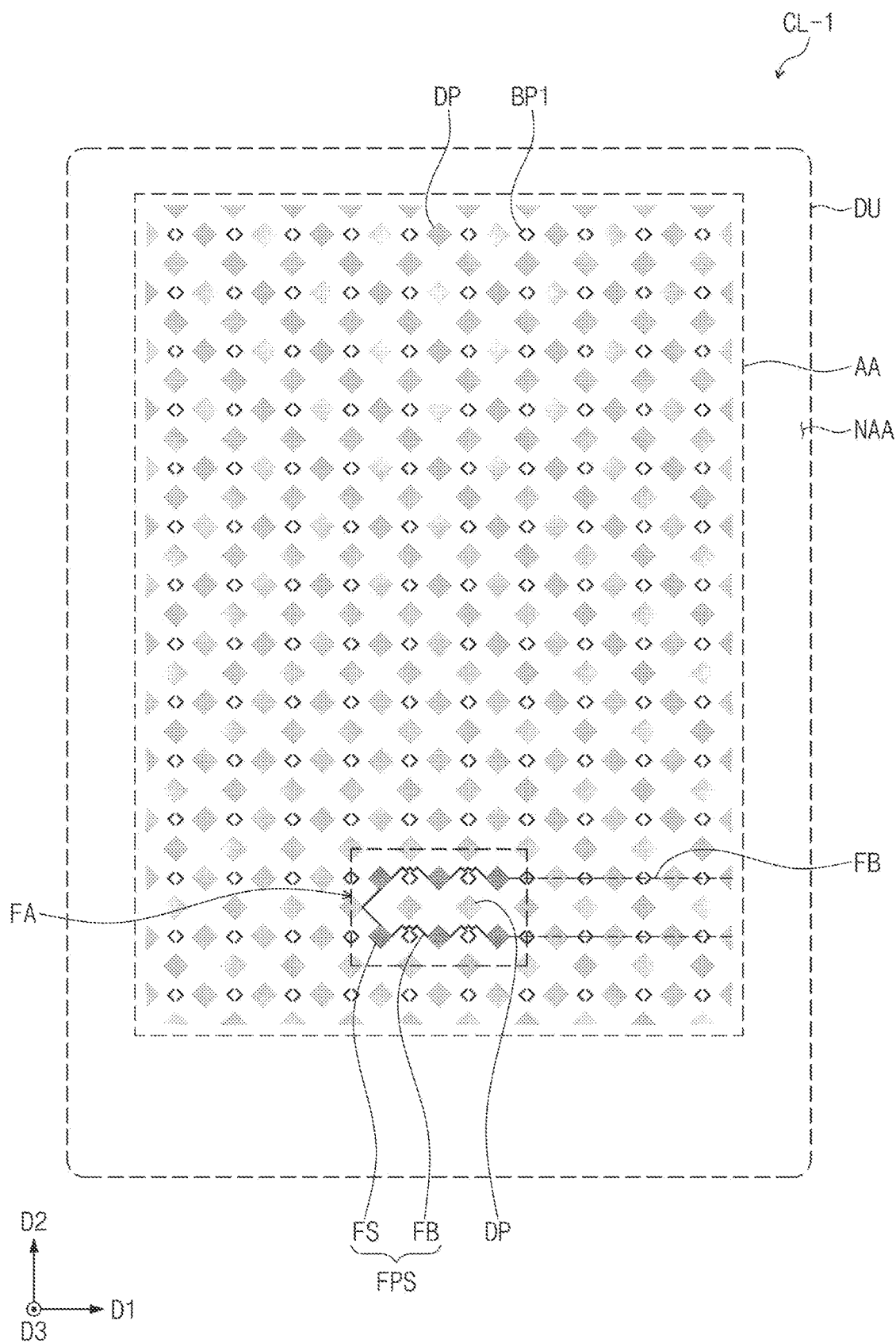
FIG. 5A is a plan view illustrating a portion of an electronic device according to some example embodiments of the inventive concept.

Referring to FIG. 5A, a first conductive layer CL-1 according to some example embodiments of the inventive concept may be located on the display unit DU. For example, the first conductive layer CL-1 may be defined as a layer, which is directly arranged on the encapsulation layer TFE (e.g., see FIG. 2) of the display unit DU.

According to some example embodiments, the first conductive layer CL-1 may include the first connection patterns BP1, the dummy patterns DP, the strain sensing patterns FS, and the strain connection patterns FB of the input sensing unit TU. The first connection patterns BP1, the dummy patterns DP, the strain sensing patterns FS, and the strain connection patterns FB may be located in the active region AA.

The dummy patterns DP may be spaced apart from the strain sensing patterns FS. Some of the dummy patterns DP may be located in the sensing region FA. In other words, the dummy patterns DP may be located in a region of the sensing region FA, in which the strain sensing patterns FS are not located. The strain sensing patterns FS and the dummy patterns DP may have the same arrangement. Thus, in the sensing region FA, the strain sensing patterns FS may have the same function as the dummy patterns DP. Accordingly, it may be possible to realize the electronic device ED with improved visibility.

The strain connection patterns FB, which are extended from the sensing region FA to the active region AA (i.e., in the first direction D1), are depicted by the dotted lines.

Figure 5B:
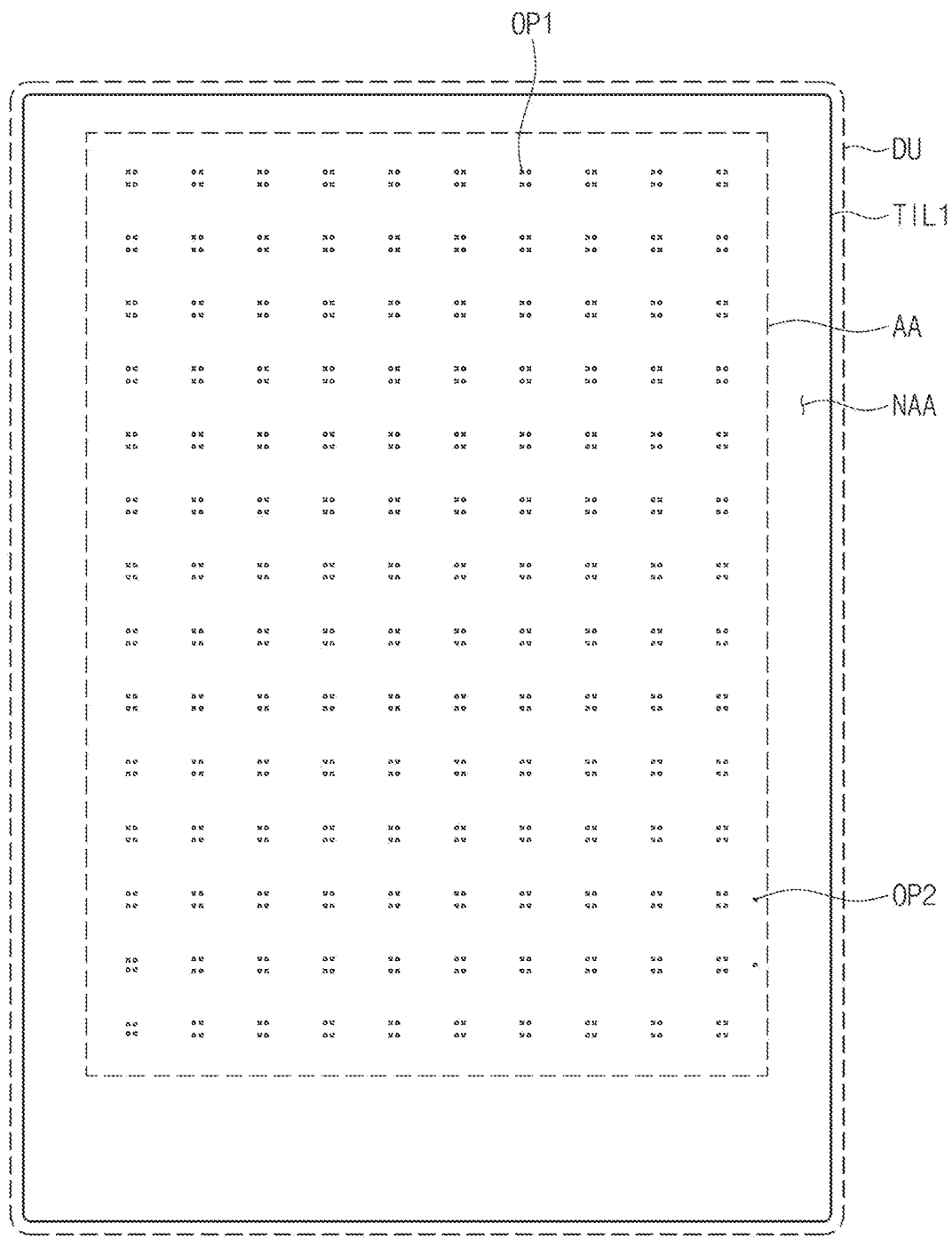
FIG. 5B is a plan view illustrating a portion of an electronic device according to some example embodiments of the inventive concept.
Figure 5B:
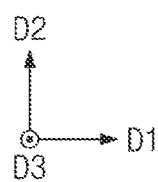

Referring to FIG. 5B, a first sensing insulating layer TIL1 according to some example embodiments of the inventive concept may be located on the front surface of the display unit DU to cover the first conductive layer CL-1. The first sensing insulating layer TIL1 may include a plurality of openings OP1 and OP2.

The openings OP1 and OP2 may be formed to penetrate the first sensing insulating layer TIL1. First openings OP1 may be overlapped with the first connection patterns BP1. The first sensing patterns SP1, which will be described below, may be connected to the first connection patterns BP1 through the first openings OP1 defined in the first sensing insulating layer TIL1. Second openings OP2 may be overlapped with the strain connection patterns FB. The strain lines FL1 and FL2, which will be described below, may be connected to the strain connection patterns FB through the second openings OP2 defined in the first sensing insulating layer TIL1.

The first sensing insulating layer TIL1 may include at least one of silicon nitride, silicon oxide, and compounds thereof. The first sensing insulating layer TIL1 may be formed through a deposition process.

Figure 5C:
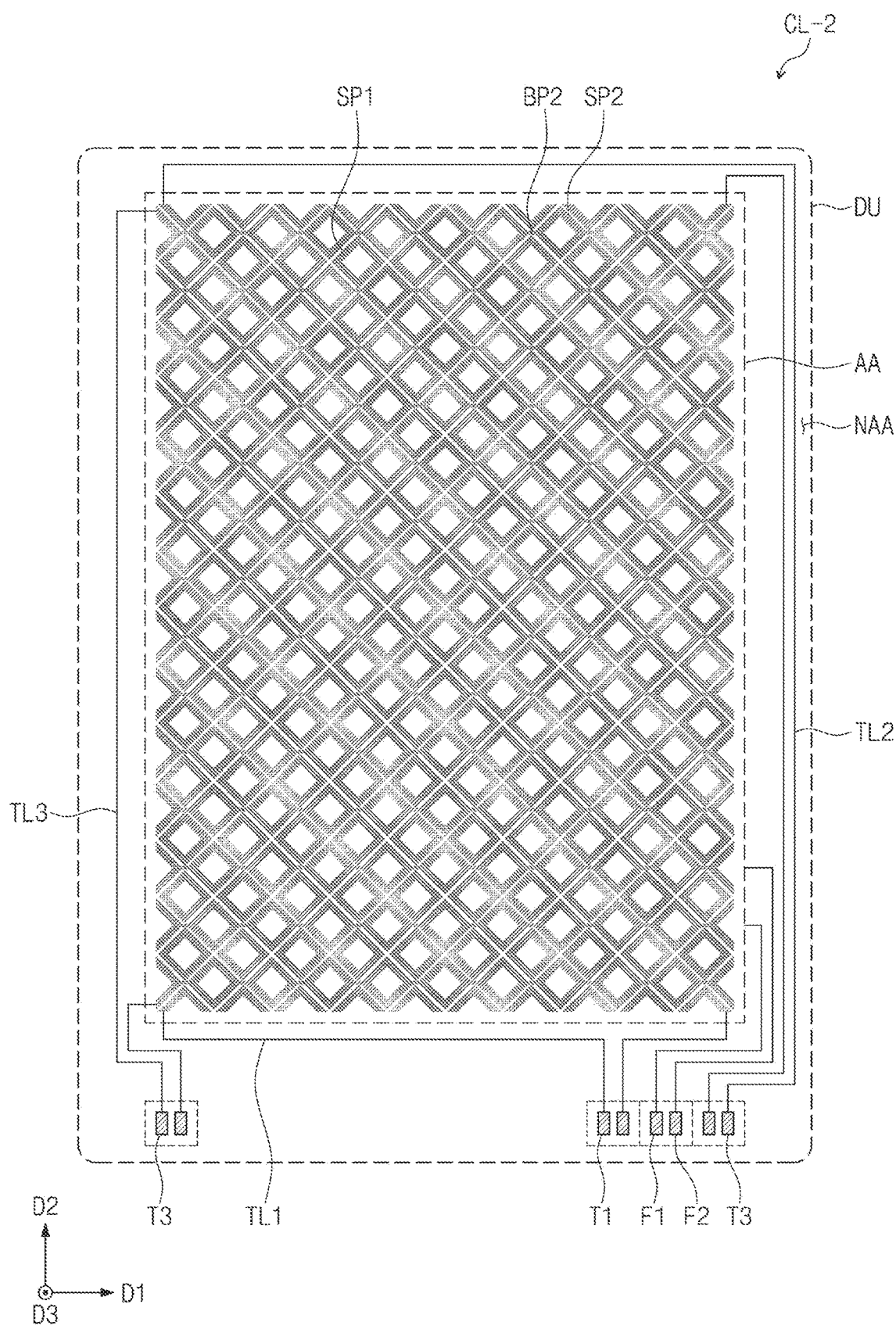
FIG. 5C is a plan view illustrating a portion of an electronic device according to some example embodiments of the inventive concept.

Referring to FIG. 5C, a second conductive layer CL-2 according to some example embodiments of the inventive concept may be located on the first sensing insulating layer TIL1.

According to some example embodiments, the second conductive layer CL-2 may include the first sensing patterns SP1, the second sensing patterns SP2, and the second connection patterns BP2, the sensing lines TL1, TL2, and TL3, the strain lines FL1 and FL2, and a plurality of pads T1, T2, T3, F1, and F2 of the input sensing unit TU.

The first sensing patterns SP1, the second sensing patterns SP2, and the second connection patterns BP2 may be located in the active region AA, and the sensing lines TL1, TL2, and TL3, the strain lines FL1 and FL2, and the plurality of pads T1, T2, T3, F1, and F2 may be located in the peripheral region NAA.

The first sensing patterns SP1 and the second sensing patterns SP2 may be spaced apart from each other, and the second connection patterns BP2 may connect the second sensing patterns SP2, which are spaced apart from each other.

Each of the first and second sensing patterns SP1 and SP2 may have a lozenge shape whose center region is an empty region. Here, the strain sensing patterns FS and the dummy patterns DP, which are located in the first conductive layer CL-1, may be overlapped with different ones of the empty regions. Accordingly, when viewed in a plan view, each of the first and second sensing patterns SP1 and SP2 may enclose one strain sensing pattern FS or one dummy pattern DP overlapped therewith.

Figure 5D:
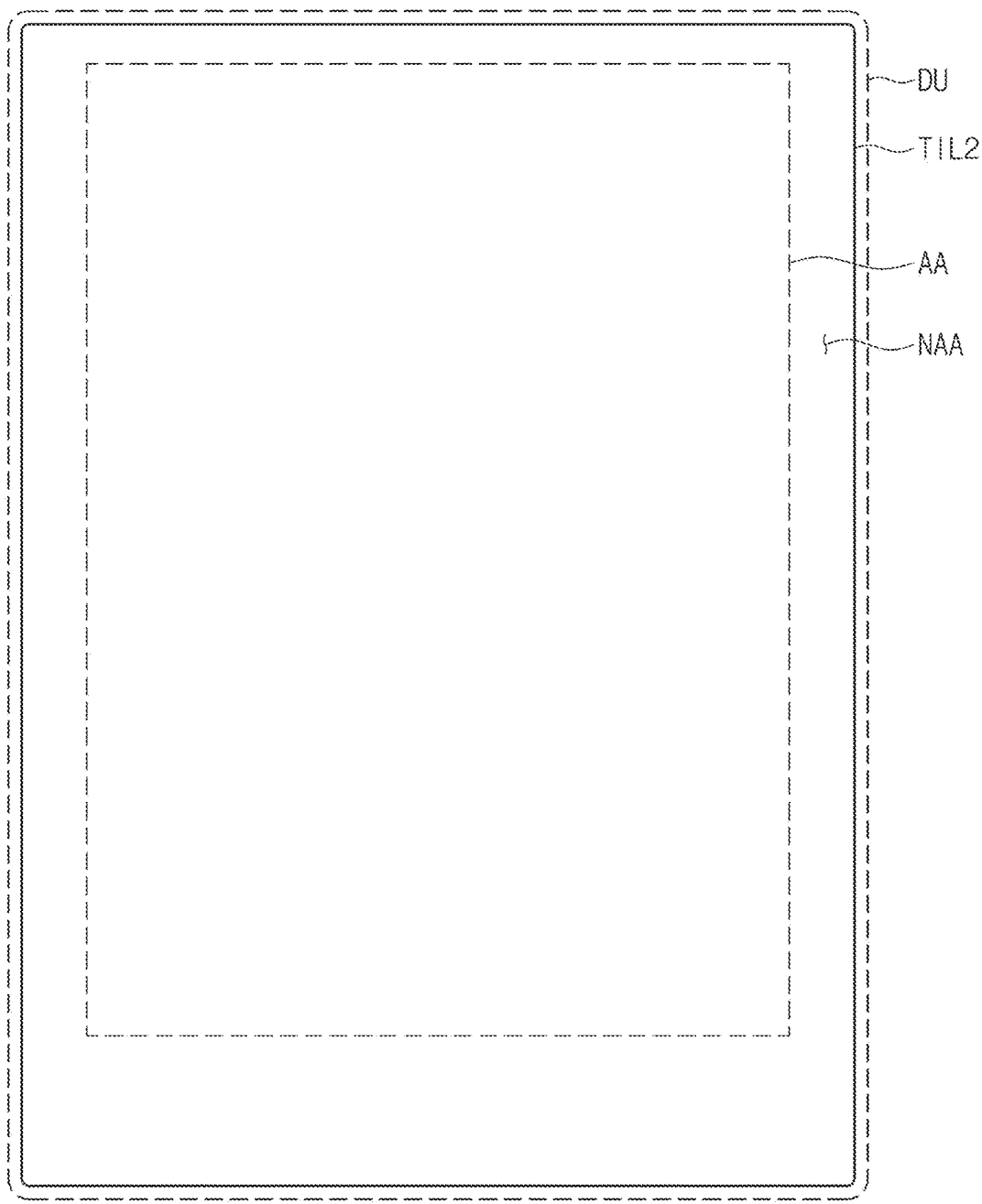
FIG. 5D is a plan view illustrating a portion of an electronic device according to some example embodiments of the inventive concept.

Referring to FIG. 5D, a second sensing insulating layer TIL2 according to some example embodiments of the inventive concept may be located on the front surface of the first sensing insulating layer TIL1 to cover the second conductive layer CL-2.

The second sensing insulating layer TIL2 may include at least one of silicon nitride, silicon oxide, and compounds thereof. The second sensing insulating layer TIL2 may be formed through a deposition process.

FIG. 6 illustrates an enlarged view of elements, which are included in the first and second conductive layers CL-1 and CL-2 and are located in the sensing region FA, and FIG. 7 illustrates an enlarge view of a region QQ' of FIG. 6.

Referring to FIGS. 6 and 7, the first conductive layer CL-1 and the second conductive layer CL-2 may include a plurality of mesh lines MSL. The mesh lines MSL may include a first mesh line MSL1, which extends in a fourth direction D4, and a second mesh line MSL2, which extends in a fifth direction D5 and crosses the first mesh line MSL1. The first mesh line MSL1 and the second mesh line MSL2 may form mesh openings MSL-OP1, MSL-OP2, MSL-OP3, and MSL-OP4.

A first mesh opening MLS-OP1 may be formed by the mesh lines MSL of the sensing patterns SP1 and SP2. FIG. 6 illustrates the first mesh opening MLS-OP1, which is included in the first sensing patterns SP1 among the sensing patterns SP1 and SP2.

A second mesh opening MLS-OP2 may be formed by the mesh lines MSL of the dummy patterns DP. Furthermore, a third mesh opening MLS-OP3 and a fourth mesh opening MLS-OP4 may be formed by the mesh lines MSL of the strain sensing patterns FS. For example, the third mesh opening MSL-OP3 may be formed by partly-cut portions of the mesh lines MSL of the strain sensing patterns FS, and the fourth mesh opening MSL-OP4 may be formed by partly-cut portions of the mesh lines MSL of the strain sensing patterns FS and the dummy patterns DP.

When viewed in a plan view, the mesh openings MSL-OP1, MSL-OP2, MSL-OP3, and MSL-OP4 may be spaced apart from light-emitting regions PXL (e.g., see FIG. 16B), to which light generated by the organic light emitting device OLED (e.g., see FIG. 3B) is provided. Thus, light, which is emitted from the display unit DU (e.g., see FIG. 1B), may be provided to the window member WM (e.g., see FIG. 1B), without interference with the mesh lines MSL.

In FIGS. 6 and 7, a shaded region depicts a strain sensing region AF of the sensing region FA, in which a change in resistance caused by pressure is sensed. One of the strain sensing patterns FS of the pressure sensing sensor FPS may be located in the strain sensing region AF.

As shown in FIG. 7, one strain sensing pattern FS included in the strain sensing region AF may be linear. To realize the linear strain sensing pattern FS, the dummy patterns DP, which are floated from the strain sensing patterns FS, may be located in the strain sensing region AF. In FIG. 7, the linear strain sensing pattern FS is depicted with a thick line.

According to some example embodiments, the main circuit substrate MF (e.g., see FIG. 1B), which is connected to the pressure sensing sensor FPS (e.g., see FIG. 4), may include a resistance variation measuring circuit, such as Wheatstone bridge. The strain sensing patterns FS may be included in a Wheatstone bridge with three different resistances to sense a change in resistance caused by pressure applied thereto.

The strain sensing patterns FS spaced apart from each other may be connected to each other by the strain connection patterns FB. The strain connection patterns FB and the first connection patterns BP1 in the first conductive layer CL-1 may be spaced apart from each other, and, when viewed in a plan view, the strain connection patterns FB may be spaced apart from the second connection patterns BP2 in the second conductive layer CL-2.

In addition, the first connection patterns BP1 and the second connection patterns BP2, which are located on different layers, may be spaced apart from each other. According to some example embodiments, because the connection patterns BP1, BP2, and FB are spaced apart from each other in a plan view, it may be possible to alleviate an electric interference issue, such as occurrence of parasitic capacitance.

Referring to FIG. 8, the strain sensing patterns FS, the strain connection patterns FB, the dummy patterns DP, and the first connection patterns BP1 may be located on the display unit DU, and the first sensing patterns SP1, the second sensing patterns SP2, and the second connection patterns BP2 may be located on the first sensing insulating layer TIL1. According to some example embodiments, the strain sensing patterns FS may not be overlapped with the first and second sensing patterns SP1 and SP2.

Figure 9:
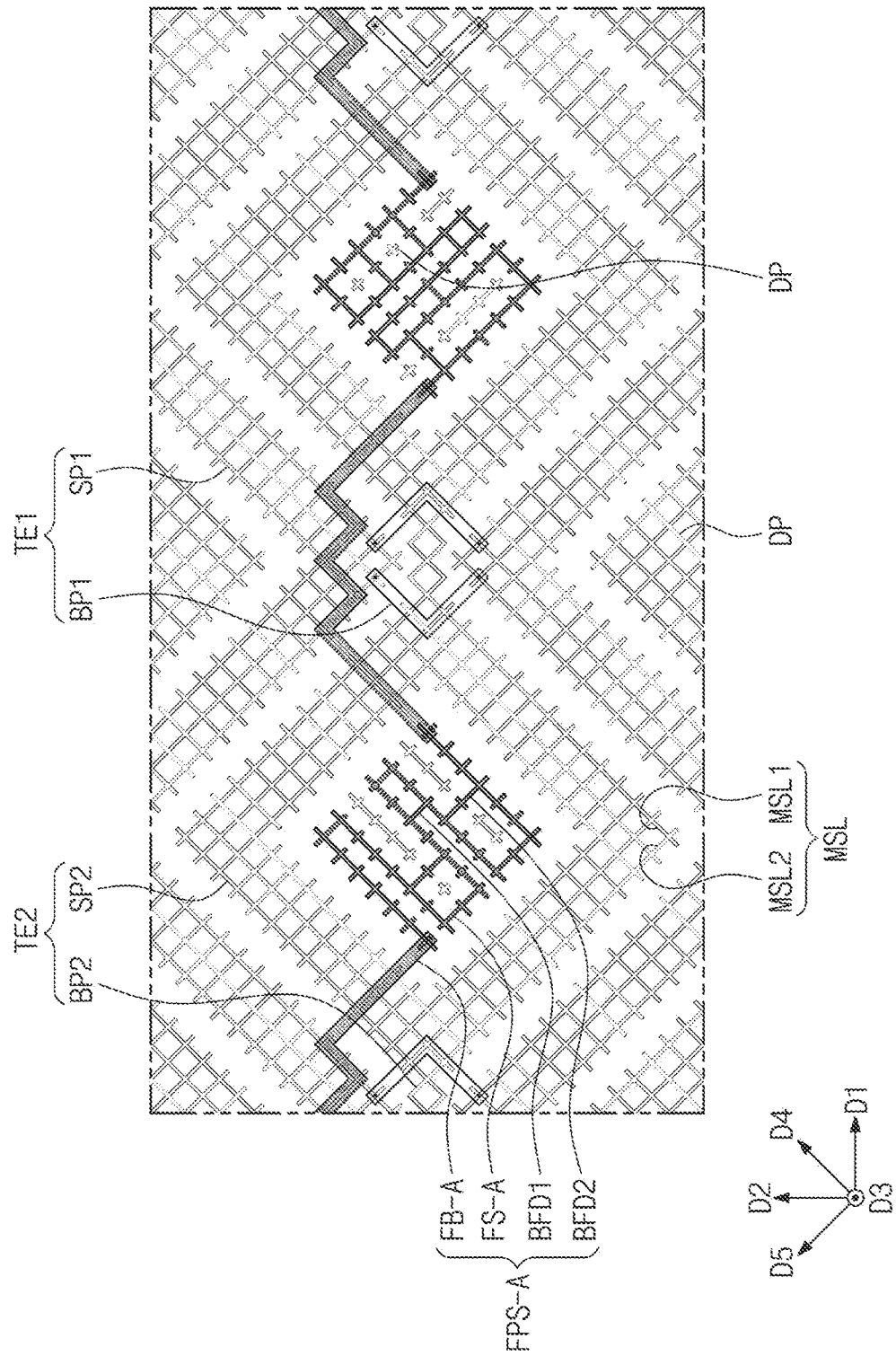
FIG. 9 is an enlarged view illustrating a sensing region according to some example embodiments of the inventive concept.

FIG. 9 is an enlarged view illustrating a sensing region according to some example embodiments of the inventive concept. For concise description, an element previously described with reference to FIGS. 1A to 8 may be identified by the same or similar reference number without repeating an overlapping description thereof.

FIG. 9 is an enlarged plan view illustrating a region corresponding to FIG. 7. Referring to FIG. 9, a pressure sensing sensor FPS-A according to some example embodiments of the inventive concept may include strain sensing patterns FS-A, strain connection patterns FB-A, and strain adding patterns BFD1 and BFD2.

Unlike the linear strain sensing patterns FS shown in FIG. 7, the strain sensing patterns FS-A according to some example embodiments of the inventive concept may be composed of rectangular or square patterns and linear patterns, which are connected to each other. For example, the strain adding patterns BFD1 and BFD2 may be located between the strain sensing patterns FS-A to connect adjacent ones of the strain sensing patterns FS-A to each other. Accordingly, each of the strain sensing patterns FS-A may be a structure, in which linear and rectangular (or square) patterns are mixed.

According to some example embodiments, the pressure sensing sensor FPS-A may include the strain sensing patterns FS-A, in which rectangular and linear patterns of different widths are included, and thus, it may be possible to more easily sense a change in resistance caused by pressure.

Figure 10:
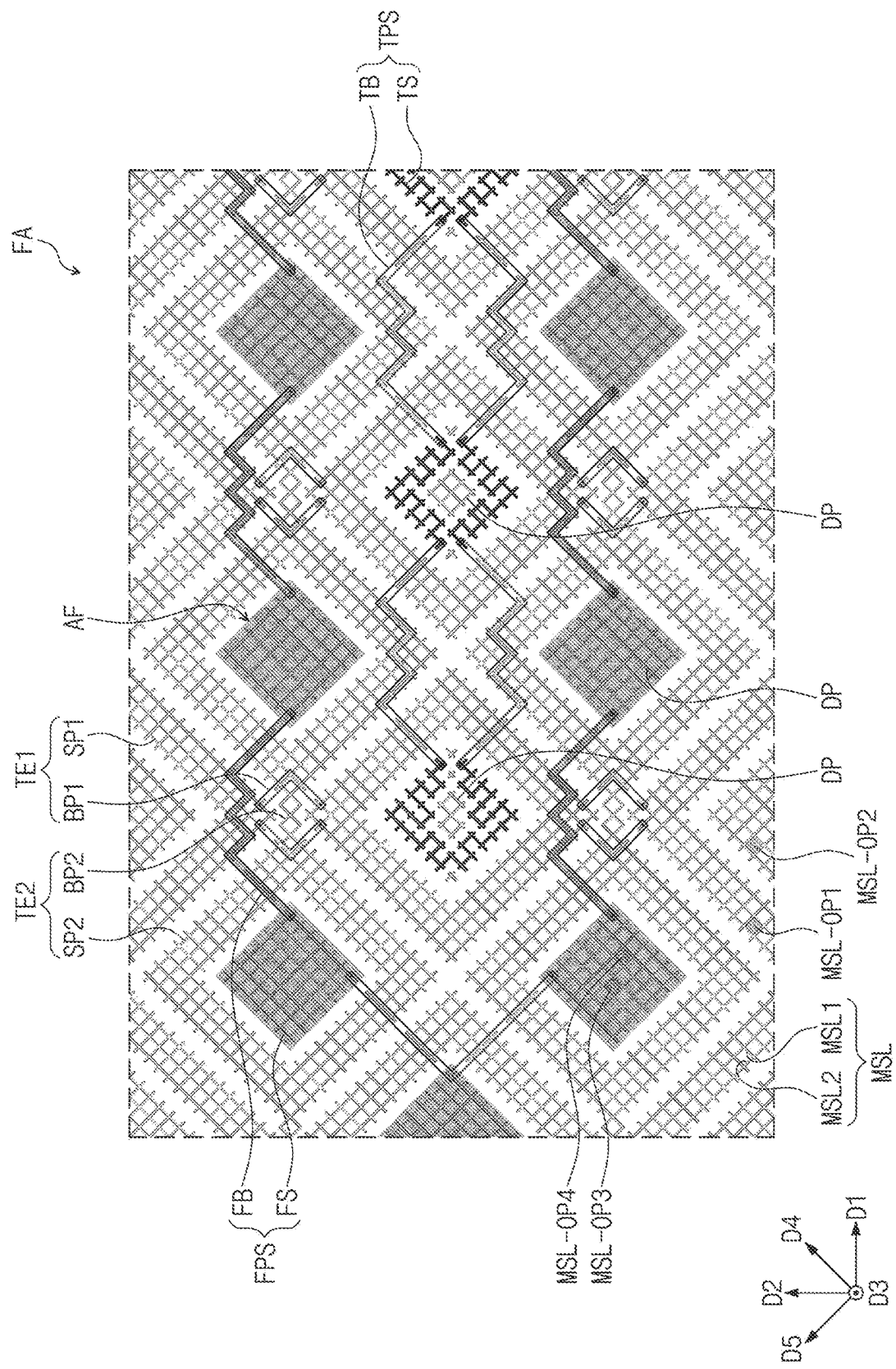
FIG. 10 is an enlarged view illustrating a sensing region according to some example embodiments of the inventive concept.

FIG. 10 is an enlarged view illustrating a sensing region according to some example embodiments of the inventive concept. For concise description, an element previously described with reference to FIGS. 1A to 8 may be identified by the same or similar reference number without repeating an overlapping description thereof.

FIG. 10 is an enlarged plan view of the sensing region FA corresponding to a region shown in FIG. 6. The electronic device ED (e.g., see FIG. 1A) according to some example embodiments may further include a temperature sensing sensor TPS. The temperature sensing sensor TPS may include temperature sensing patterns TS and temperature connection patterns TB. The temperature sensing sensor TPS may be located on the first conductive layer CL-1 (e.g., see FIG. 5A). Thus, the temperature sensing sensor TPS and the pressure sensing sensor FPS may be located on the same layer.

The temperature sensing patterns TS and the temperature connection patterns TB may be located in the sensing region FA. The temperature sensing patterns TS may be spaced apart from the strain sensing patterns FS, the first sensing patterns SP1, the second sensing patterns SP2, and the dummy patterns DP, when viewed in a plan view.

When viewed in a plan view, each of the temperature sensing patterns TS may be enclosed by at least one of the first and second sensing patterns SP1 and SP2.

The temperature sensing patterns TS may be linear. Thus, the dummy patterns DP may be located in the linear temperature sensing patterns TS. In FIG. 10, the linear temperature sensing patterns TS are depicted with thick lines.

The temperature connection patterns TB may connect the temperature sensing patterns TS, which are spaced apart from each other. The temperature connection patterns TB and the strain connection patterns FB may be located on the same layer and may have the same shape.

The temperature sensing sensor TPS, in which the temperature sensing patterns TS and the temperature connection patterns TB are connected to each other, may be linear. According to some example embodiments, one of two opposite ends of the temperature sensing sensor TPS may be applied with a driving signal transferred from the driving device MC (e.g., see FIG. 1B), and the other may transfer measurement data, which are obtained from a change in temperature caused by temperature, to the main circuit substrate MF.

According to some example embodiments, the main circuit substrate MF (e.g., see FIG. 1B), which is connected to the temperature sensing sensor TPS, may include a temperature-change measuring circuit, such as Wheatstone bridge. The temperature sensing patterns TS may be included in a Wheatstone bridge with three different resistances to sense a change in resistance caused by temperature.

According to some example embodiments, an additional temperature-sensing module may not be provided, but the electronic device ED (e.g., see FIG. 1B) may be provided to include the pressure sensing sensor FPS and the temperature sensing sensor TPS, which are located in the input sensing unit TU (e.g., see FIG. 1B).

Figure 11A:
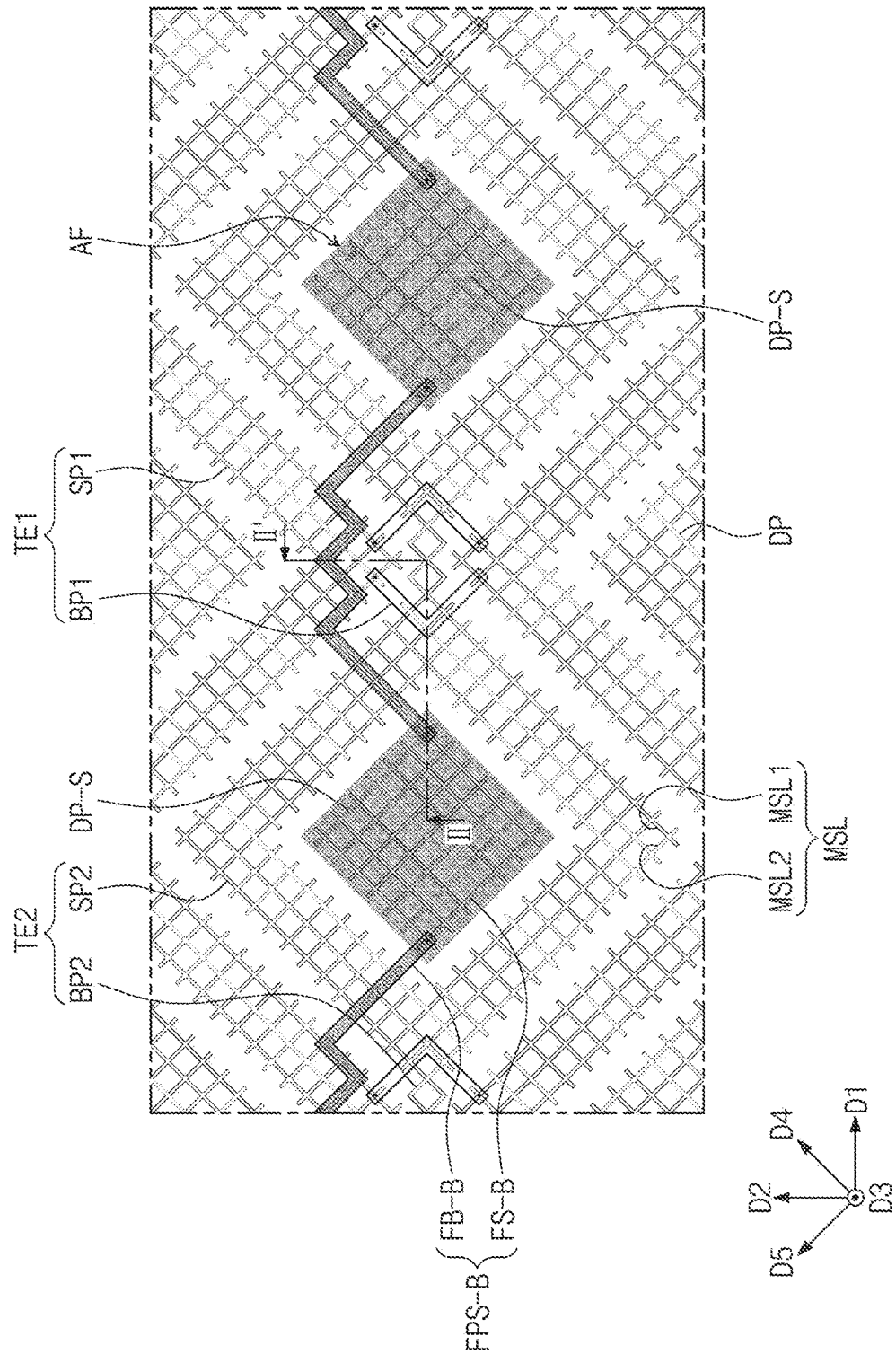
FIG. 11A is an enlarged view illustrating a sensing region according to some example embodiments of the inventive concept.
Figure 11B:
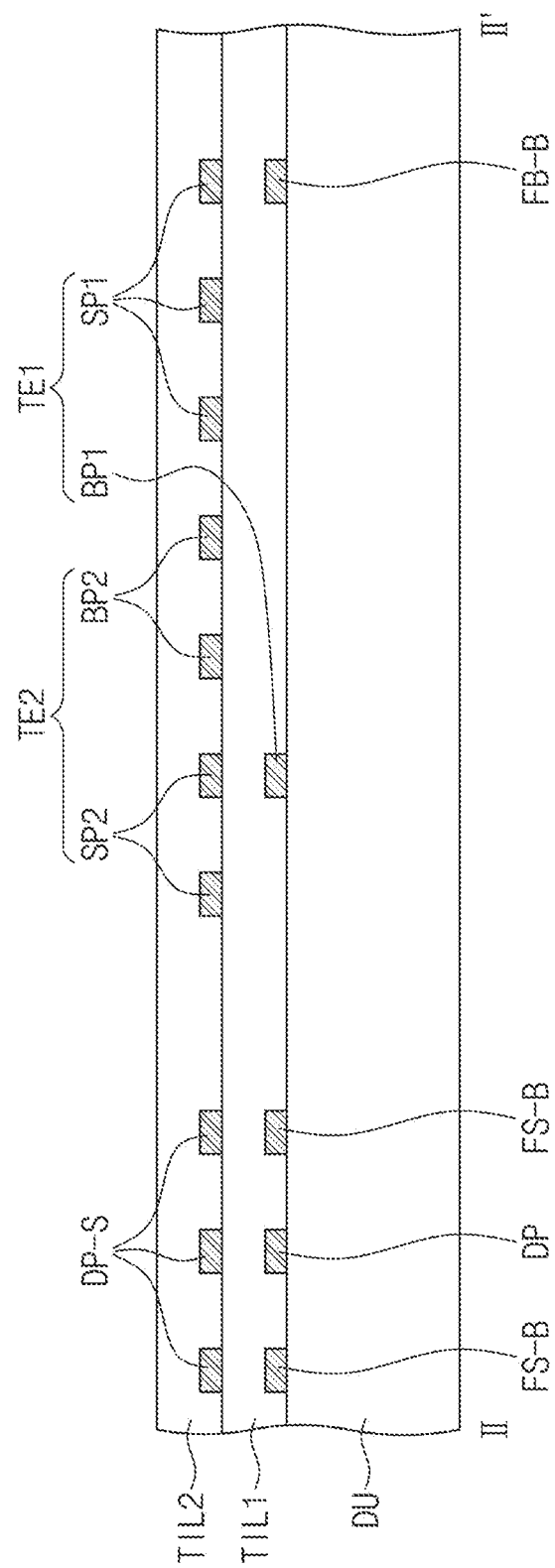
FIG. 11B is a sectional view taken along a line II-II' of FIG. 11A.

FIG. 11A is an enlarged view illustrating a sensing region according to some example embodiments of the inventive concept. FIG. 11B is a sectional view taken along a line II-II' of FIG. 11A. For concise description, an element previously described with reference to FIGS. 1A to 8 may be identified by the same or similar reference number without repeating an overlapping description thereof.

FIG. 11A is an enlarged plan view illustrating a region corresponding to FIG. 7. Referring to FIG. 11A, the electronic device ED (e.g., see FIG. 1A) according to some example embodiments of the inventive concept may further include sub-dummy patterns DP-S. The sub-dummy patterns DP-S may be located to be overlapped with the strain sensing region AF, when viewed in a plan view. The sub-dummy patterns DP-S may include the mesh lines MSL (e.g., see FIG. 6).

Strain sensing patterns FS-B, which are included in a pressure sensing sensor FPS-B, may be located in the strain sensing region AF. The strain sensing patterns FS-B and strain connection patterns FB-B of the pressure sensing sensor FPS-B in the present embodiment may be the same elements as the strain sensing patterns FS and the strain connection patterns FB of the pressure sensing sensor FPS shown in FIG. 7.

Referring to FIG. 11B, the sub-dummy patterns DP-S may be spaced apart from the strain sensing patterns FS-B, with the first sensing insulating layer TIL1 interposed therebetween. The sub-dummy patterns DP-S may be overlapped with the strain sensing patterns FS-B. The sub-dummy patterns DP-S and the first sensing patterns SP1 and the second sensing patterns SP2 may be located on the same layer.

When viewed in a plan view, each of the sub-dummy patterns DP-S may be enclosed by at least one of the first and second sensing patterns SP1 and SP2.

According to some example embodiments, because the sub-dummy patterns DP-S overlapped with the strain sensing patterns FS-B are provided, it may be possible to prevent or reduce a parasitic capacitance between the strain sensing patterns FS-B and the sensing patterns SP1 and SP2. That is, because the sub-dummy patterns DP-S are provided, the input sensing unit TU (e.g., see FIG. 1B) may be provided to have improved reliability.

Figure 12A:
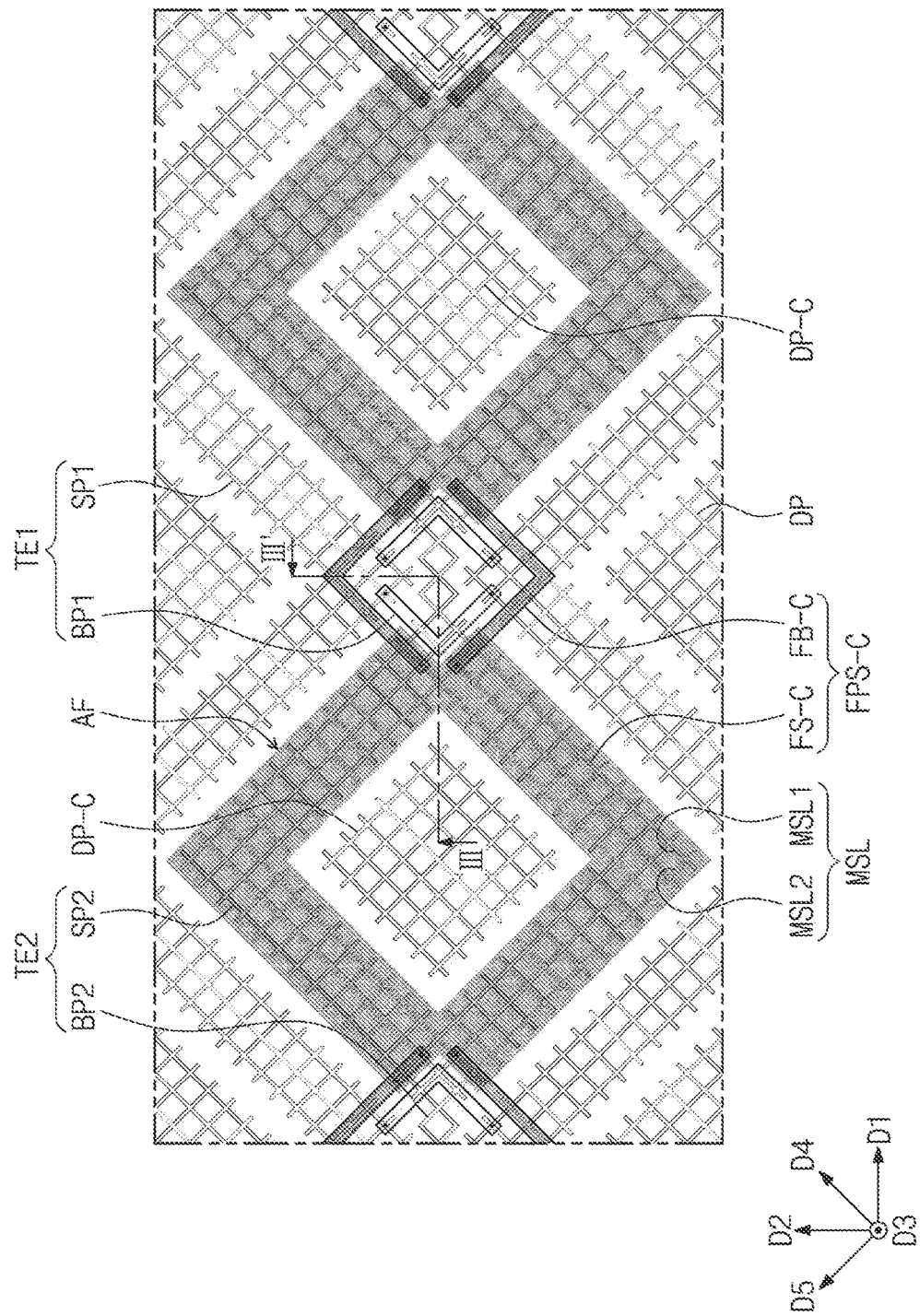
FIG. 12A is an enlarged view illustrating a sensing region according to some example embodiments of the inventive concept.
Figure 12B:
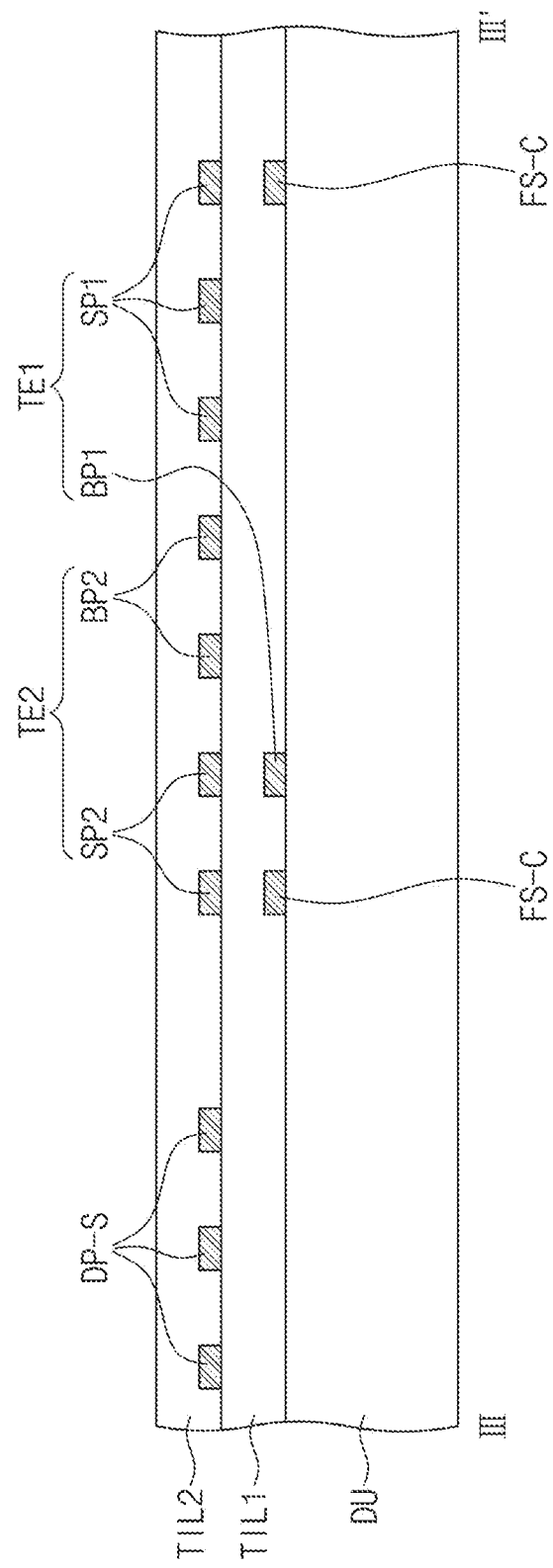
FIG. 12B is a sectional view taken along a line III-III' of FIG. 12A.

FIG. 12A is an enlarged view illustrating a sensing region according to some example embodiments of the inventive concept. FIG. 12B is a sectional view taken along a line III-III' of FIG. 12A. For concise description, an element previously described with reference to FIGS. 1A to 8 may be identified by the same or similar reference number without repeating an overlapping description thereof.

FIG. 12A is an enlarged plan view illustrating a region corresponding to FIG. 7. Referring to FIG. 12A, the electronic device ED (e.g., see FIG. 1A) according to some example embodiments of the inventive concept may further include a pressure sensing sensor FPS-C and sub-dummy patterns DP-C.

In FIG. 12A, a shaded region depicts the strain sensing region AF, in which a change in resistance caused by pressure is sensed. A pressure sensing sensor FPS-C may include strain sensing patterns FS-C and strain connection patterns FB-C. One of strain sensing patterns FS-C of the pressure sensing sensor FPS-C may be located in the strain sensing region AF. According to some example embodiments, the strain sensing patterns FS-C may be linear.

Referring to FIG. 12B, the strain sensing patterns FS-C may be overlapped with at least one of the sensing patterns SP1 and SP2. FIGS. 12A and 12B illustrate an example, in which the strain sensing patterns FS-C are arranged to overlap with the second sensing patterns SP2.

The strain sensing patterns FS-C may be spaced apart from the sensing patterns SP1 and SP2, with the first sensing insulating layer TIL1 interposed therebetween. The strain sensing patterns FS-C may be overlapped with the second sensing patterns SP2.

When viewed in a plan view, each of the sub-dummy patterns DP-C may be enclosed by at least one of the first and second sensing patterns SP1 and SP2. The sub-dummy patterns DP-C may be the same element as the sub-dummy patterns DP-S shown in FIGS. 11A and 11B.

Figure 13A:
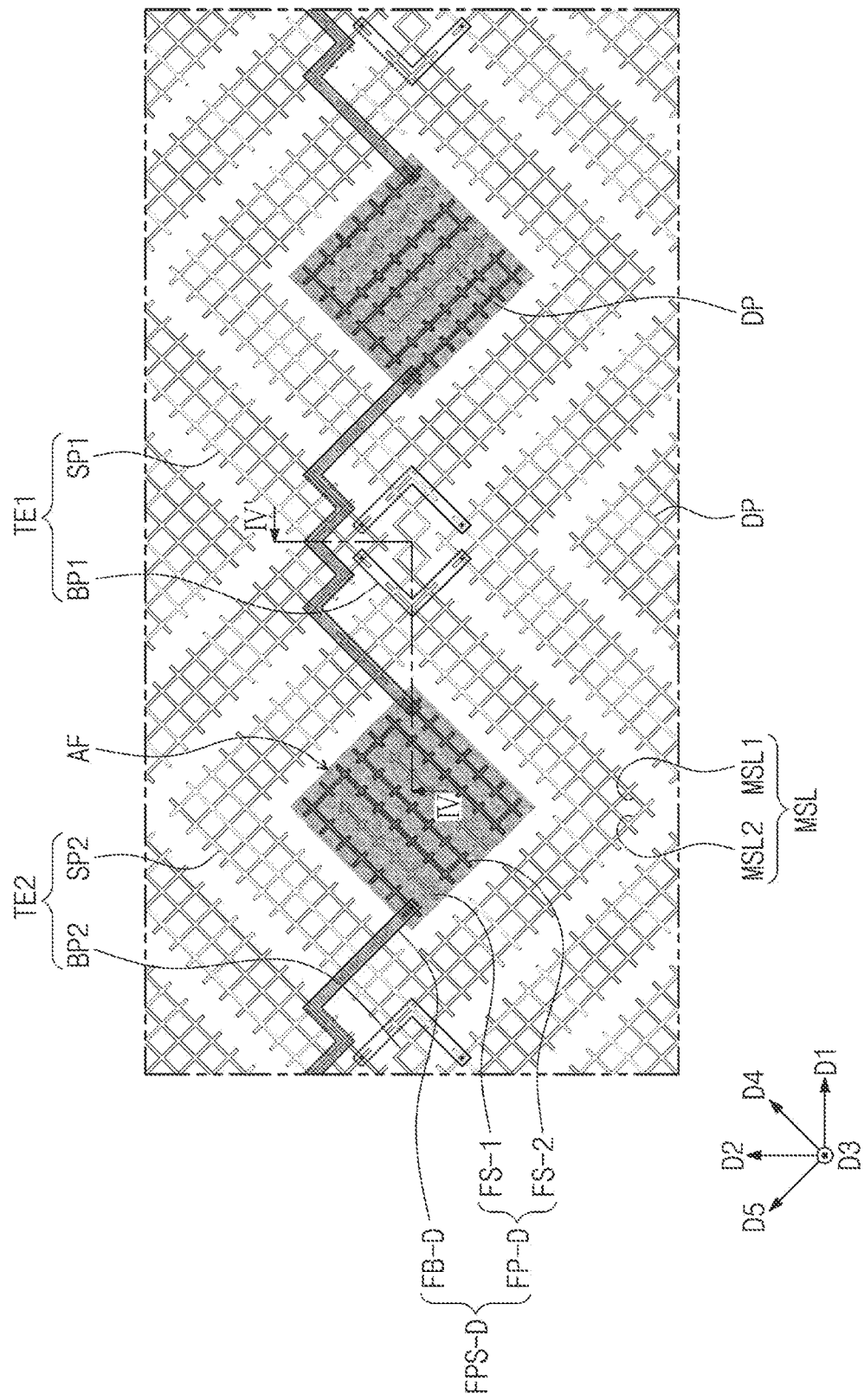
FIG. 13A is an enlarged view illustrating a sensing region according to some example embodiments of the inventive concept.
Figure 13B:
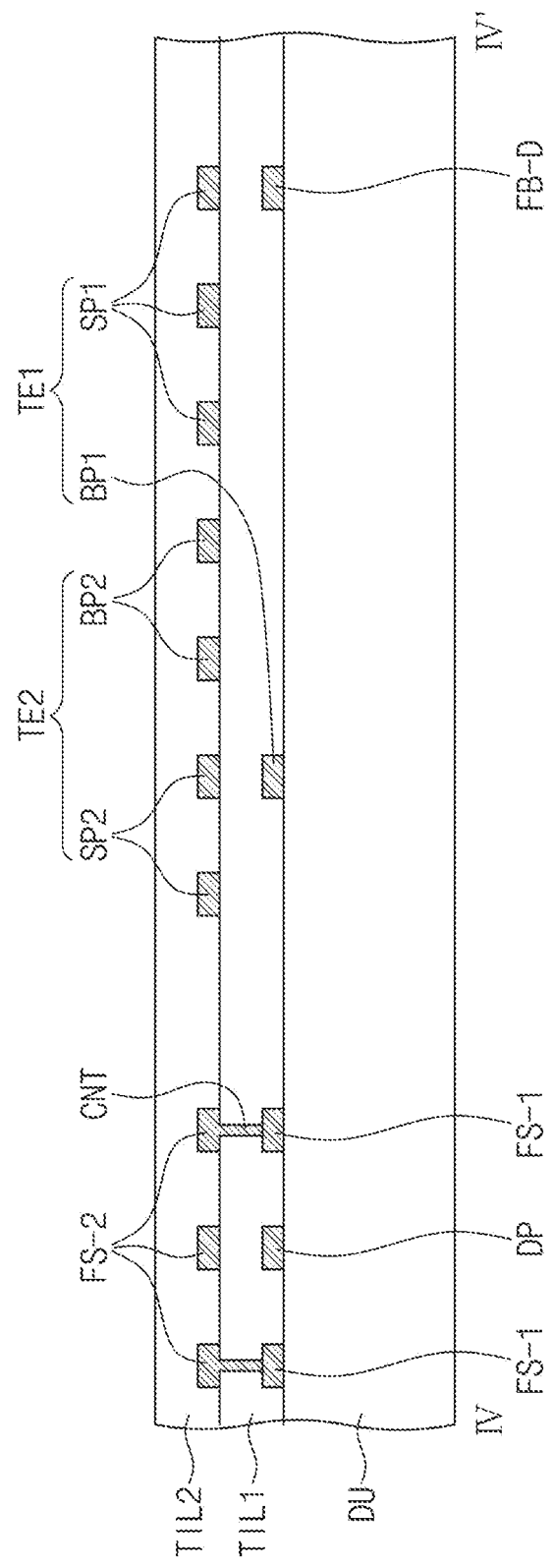
FIG. 13B is a sectional view taken along a line IV-IV' of FIG. 13A.

FIG. 13A is an enlarged view illustrating a sensing region according to some example embodiments of the inventive concept. FIG. 13B is a sectional view taken along a line IV-IV' of FIG. 13A. For concise description, an element previously described with reference to FIGS. 1A to 8 may be identified by the same or similar reference number without repeating an overlapping description thereof.

FIG. 13A is an enlarged plan view illustrating a region corresponding to FIG. 7. Referring to FIGS. 13A and 13B, the electronic device ED (e.g., see FIG. 1A) according to some example embodiments of the inventive concept may further include a pressure sensing sensor FPS-D including strain sensing patterns FS-D, which have a double layered structure, and strain connection patterns FB-D.

The strain sensing patterns FS-D having the double layered structure may be located in the strain sensing region AF. Each of the strain sensing patterns FS-D may include first strain sensing patterns FS-1 and auxiliary strain sensing patterns FS-2.

According to some example embodiments, the first strain sensing patterns FS-1 and the strain connection patterns FB-D may be the same elements as the strain sensing patterns FS and the strain connection patterns FB shown in FIGS. 6 and 7.

At least a portion of the auxiliary strain sensing patterns FS-2 may be overlapped with the first strain sensing patterns FS-1, when viewed in a sectional view. The auxiliary strain sensing patterns FS-2 may be connected to the first strain sensing patterns FS-1 through contact holes CNT, which are defined in the first sensing insulating layer TIL1, with the first sensing insulating layer TIL1 interposed therebetween. The auxiliary strain sensing patterns FS-2 and the sensing patterns SP1 and SP2 may be located on the same layer.

When viewed in a plan view, each of the auxiliary strain sensing patterns FS-2 may be enclosed by at least one of the first and second sensing patterns SP1 and SP2.

According to some example embodiments, because the pressure sensing sensor FPS-D includes the strain sensing patterns FS-D having the double layered structure, it may be possible to provide the pressure sensing sensor FPS-D, which is configured to more precisely sense a change in resistance caused by pressure.

Figure 14:
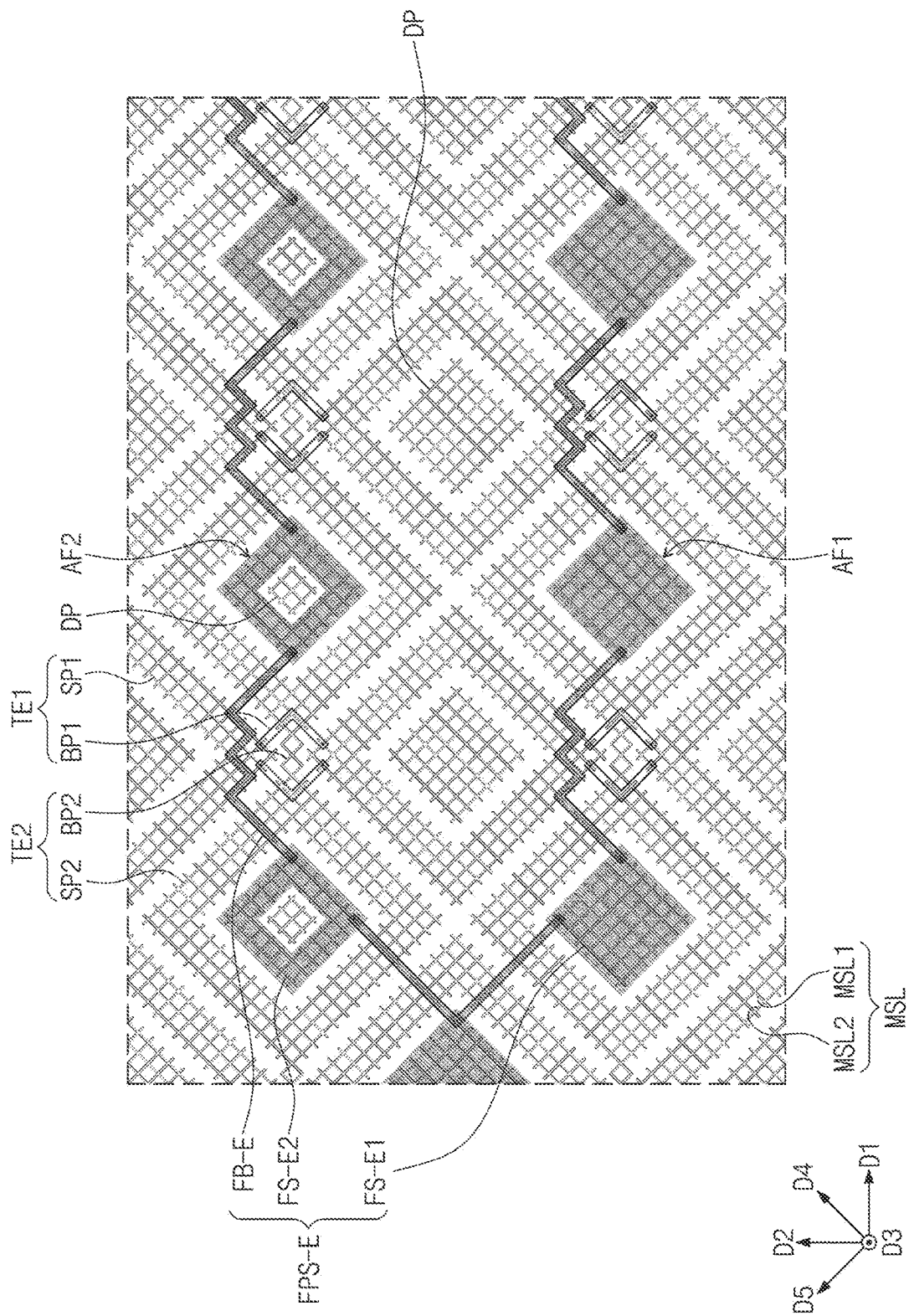
FIG. 14 is an enlarged view illustrating a sensing region according to some example embodiments of the inventive concept.

FIG. 14 is an enlarged view illustrating a sensing region according to some example embodiments of the inventive concept. For concise description, an element previously described with reference to FIGS. 1A to 8 may be identified by the same or similar reference number without repeating an overlapping description thereof.

Referring to FIG. 14, a pressure sensing sensor FPS-E according to some example embodiments of the inventive concept may include strain sensing regions AF1 and AF2 having different areas. In FIG. 14, the strain sensing regions AF1 and AF2 are depicted as shaded regions.

The strain sensing regions AF1 and AF2 may be defined as regions, which are used to sense a change in resistance.

Linear strain sensing patterns FS-E1 and FS-E2 may be located in the strain sensing regions AF1 and AF2. For example, the linear first strain sensing patterns FS-E1 may be located in the first strain sensing region AF1, and the linear second strain sensing patterns FS-E2 may be located in the second strain sensing region AF2. The strain sensing patterns FS-E1 and FS-E2 may be connected to each other by strain connection patterns FB-E.

According to some example embodiments, the strain sensing patterns FS-E1 and FS-E2 located in the strain sensing regions AF1 and AF2 may not be limited to a specific shape, as long as they have the linear shapes.

Each of the second strain sensing regions AF2 may have a lozenge shape with an empty region. Each of the first strain sensing regions AF1 may have a lozenge shape, which does not have an empty region. Thus, an area of each of the second strain sensing regions AF2 may be smaller than an area of each of the first strain sensing regions AF1.

According to some example embodiments, because the pressure sensing sensor FPS-E is provided to have the strain sensing regions AF1 and AF2 of different areas, it may be possible to provide the pressure sensing sensor FPS-E, which is configured to more precisely sense a change in resistance caused by pressure.

Figure 15A:
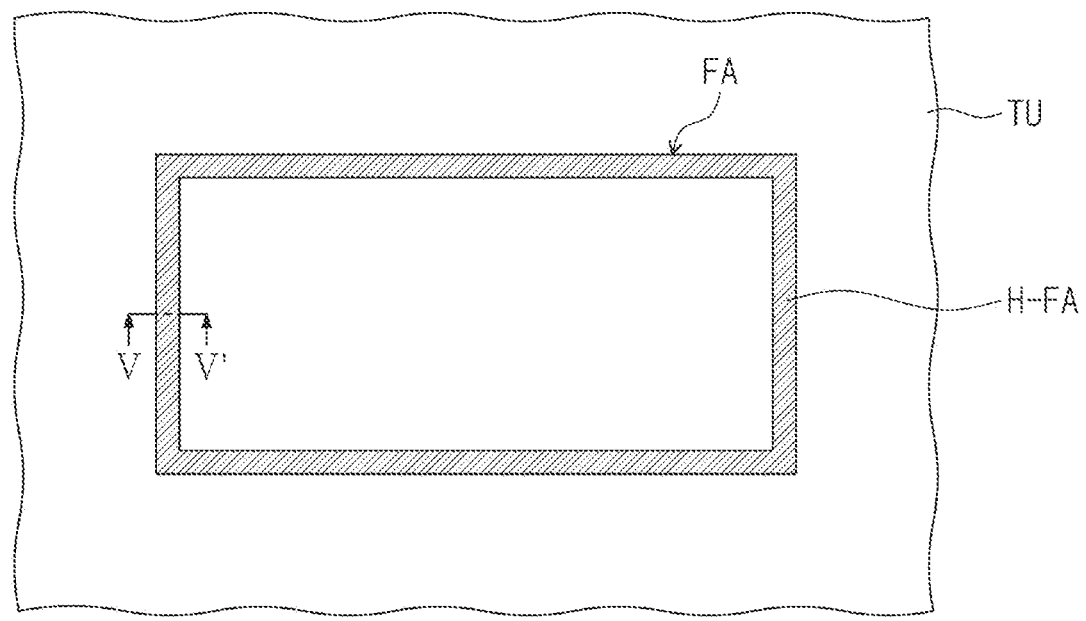
FIG. 15A is a plan view illustrating a region of an electronic device according to some example embodiments of the inventive concept.
Figure 15B:
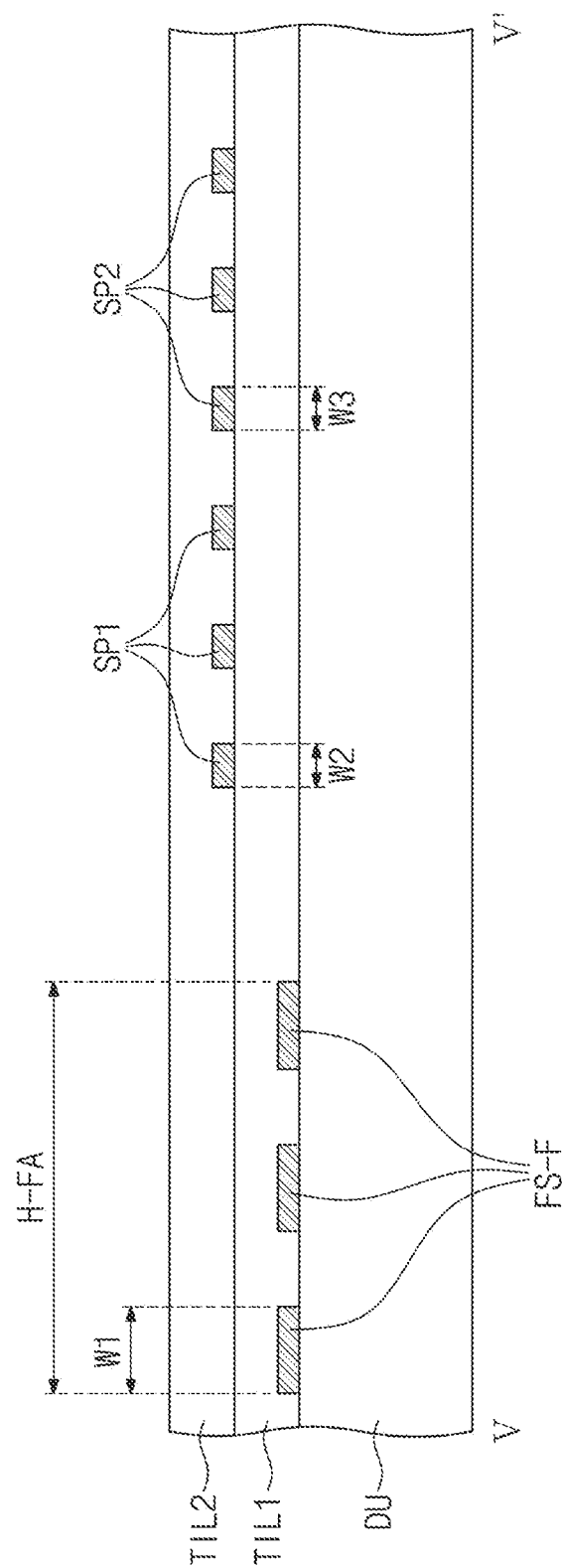
FIG. 15B is a sectional view taken along a line V-V' of FIG. 15A.

FIG. 15A is a plan view illustrating a region of an electronic device according to some example embodiments of the inventive concept. FIG. 15B is a sectional view taken along a line V-V' of FIG. 15A. For concise description, an element previously described with reference to FIGS. 1A to 8 may be identified by the same or similar reference number without repeating an overlapping description thereof.

Referring to FIGS. 15A to 15B, the sensing region FA according to some example embodiments of the inventive concept may further include a home button region H-FA.

The home button region H-FA may be a closed-line shaped region, which is enclosed by a border between the active region AA and the sensing region FA. The home button region H-FA may be recognized by an external user, due to the presence of strain sensing patterns FS-F, which are located in the home button region H-FA. Thus, the user may recognize the home button region H-FA, even when there is no additional electrical operation.

The strain sensing patterns FS-F, which are overlapped with the home button region H-FA, may have a first width W1 in a specific direction. Each of the sensing patterns SP1 and SP2, which are located in a region adjacent to the home button region H-FA and are spaced apart from the strain sensing patterns FS-F, may have a second width W2 and a third width W3 in the specific direction.

The first width W1 may be larger than the second width W2 and the third width W3. For example, the first width W1 may range from 4 μm to 5 μm. Each of the second width W2 and the third width W3 may range from 2 μm to 3 μm.

According to some example embodiments, because the first width W1 of the strain sensing patterns FS-F located in the home button region H-FA is larger than the widths W2 and W3 of the sensing patterns SP1 and SP2 spaced apart from the strain sensing patterns FS-F, a user may easily recognize the sensing region FA.

Figure 16C:
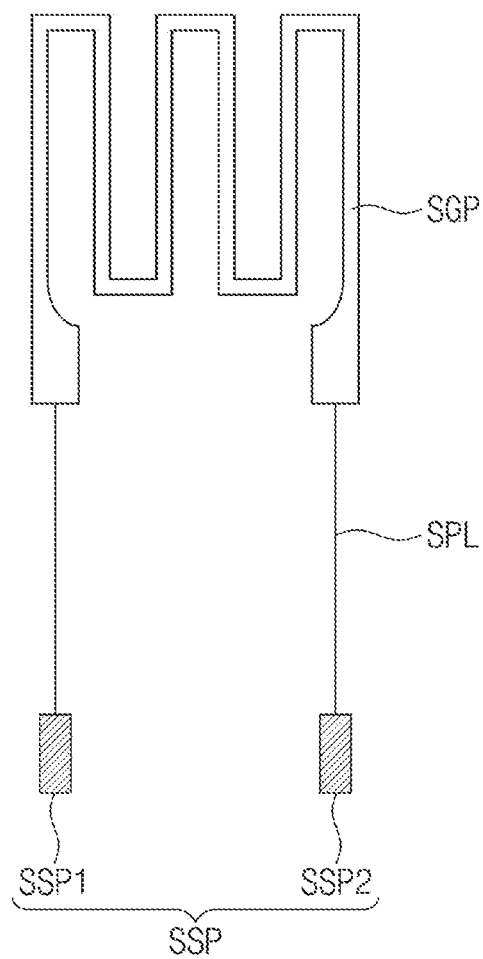
FIG. 16C is a plan view illustrating a pressure sensing sensor according to some example embodiments of the inventive concept.

FIG. 16A is a perspective view illustrating a display module according to some example embodiments of the inventive concept. FIG. 16B is a sectional view taken along a line VI-VI' of FIG. 16A. FIG. 16C is a plan view illustrating a pressure sensing sensor according to some example embodiments of the inventive concept.

Referring to FIGS. 16A to 16C, a display module DM-A according to some example embodiments of the inventive concept may include a display unit DU-A, an input sensing unit TU-A, and a sub-pressure sensing sensor SSP. According to some example embodiments, the display module DM-A may include the pressure sensing sensor FPS described with reference to FIGS. 4 to 8.

The sub-pressure sensing sensor SSP may include a sub-strain sensing pattern SGP, sub-strain sensing lines SPL, and sub-strain sensing pads SSP1 and SSP2. The sub-strain sensing lines SPL may be connected to two opposite ends of the sub-strain sensing pattern SGP, which has a linear shape, and may be extended from the active region AA to the peripheral region NAA. The sub-strain sensing lines SPL may be connected to corresponding ones of the sub-strain sensing pads SSP1 and SSP2.

The sub-strain sensing pads SSP1 and SSP2 may be connected to the main circuit substrate MF through the first flexible circuit substrate FF (e.g., see FIG. 1B) and may be used to receive a driving signal for driving the sub-strain sensing pattern SGP or provide a change in resistance, which is measured by the sub-strain sensing pattern SGP, to the main circuit substrate MF.

The display unit DU-A may include the display circuit layer CL, the display device layer EDL, and the encapsulation layer TFE, which are located on the base substrate SUB.

The display circuit layer CL and the display device layer EDL may include the pixel PX and a plurality of insulating layers 10, 20, 30, 40, 50, and PDL. In addition, elements of the sub-pressure sensing sensor SSP may be located in the display circuit layer CL.

The insulating layers 10, 20, 30, 40, 50, and PDL may include a first insulating layer 10, a second insulating layer 20, a third insulating layer 30, a fourth insulating layer 40, a fifth insulating layer 50, and a pixel definition layer PDL, which are sequentially stacked in the third direction D3.

The pixel PX according to some example embodiments of the inventive concept may include a plurality of the thin film transistors TR1 and TR2 (e.g., see FIG. 3B) and the organic light emitting device OLED. One (e.g., the second thin film transistor TR2) of the thin film transistors TR1 and TR2 serving as a driving transistor is illustrated as a thin film transistor TR in the present embodiment.

The thin film transistor TR may be located on a base substrate SUB. The thin film transistor TR may include a semiconductor pattern SP, a control electrode CE, an input electrode IE, an output electrode OE, an upper electrode UE, and a light blocking pattern BP.

The semiconductor pattern SP may be located between the first insulating layer 10 and the second insulating layer 20. The control electrode CE may be located between the second insulating layer 20 and the third insulating layer 30. When viewed in a sectional view, the control electrode CE may be overlapped with the semiconductor pattern SP. The input electrode IE and the output electrode OE may be located between the fourth insulating layer 40 and the fifth insulating layer 50. The input electrode IE and the output electrode OE may be located on the same layer and be spaced apart from each other. The input electrode IE and the output electrode OE may be provided to penetrate the second insulating layer 20, the third insulating layer 30, and the fourth insulating layer 40 and may be coupled to two opposite ends, respectively, of the semiconductor pattern SP.

The upper electrode UE may be located between the third insulating layer 30 and the fourth insulating layer 40. When viewed in a sectional view, the upper electrode UE may be overlapped with the control electrode CE. The upper electrode UE may receive various voltages. As an example, the upper electrode UE and the control electrode CE may constitute a capacitor, and in this case, the upper electrode UE may receive a voltage, which is different from that applied to the control electrode CE.

As another example, the upper electrode UE may be connected to the control electrode CE to receive the same voltage as the control electrode CE. According to some example embodiments, the upper electrode UE may be omitted from the thin film transistor TR.

The light blocking pattern BP may be located between the base substrate SUB and the first insulating layer 10. The light blocking pattern BP may be overlapped with at least the entirety of the semiconductor pattern SP, when viewed in a direction toward the rear surface of the base substrate SUB. The light blocking pattern BP may block light from being incident into the semiconductor pattern SP.

According to some example embodiments, the light blocking pattern BP may include a conductive material. For example, the light blocking pattern BP may include at least one of metals, alloys, conductive oxides, and conductive polymers.

The sub-strain sensing pattern SGP of the sub-pressure sensing sensor SSP and the light blocking pattern BP may be located on the same layer. The sub-strain sensing pattern SGP may be spaced apart from the light blocking pattern BP.

The organic light emitting device OLED may be located on the fifth insulating layer 50. The organic light emitting device OLED may include a first electrode E1, a light-emitting pattern EL, and a second electrode E2, which are sequentially stacked in the third direction D3.

The first electrode E1 may be provided to penetrate the fifth insulating layer 50 and may be coupled to the thin film transistor TR. The pixel definition layer PDL may be located on the fifth insulating layer 50. An opening may be defined in the pixel definition layer PDL. The opening may be formed to expose at least a portion of the first electrode E1. According to some example embodiments, a region, in which the opening of the pixel definition layer PDL is formed, may be defined as a light-emitting region PXL, and the remaining region except the opening may be defined as a non-light-emitting region NPXL.

The light-emitting pattern EL may be located on the first electrode E1. At least a portion of the light-emitting pattern EL may be overlapped with the first electrode E1, when viewed in a sectional view. The light-emitting pattern EL may include a light-emitting material. For example, the light-emitting pattern EL may include at least one of materials capable of emitting red, green, and blue lights and may include a fluorescent or phosphorescent material. In addition, the light-emitting pattern EL may include an organic light-emitting material or an inorganic light-emitting material, such as quantum dots. The light-emitting pattern EL may emit a light in response to a potential difference between the first electrode E1 and the second electrode E2.

The second electrode E2 may be located on the light-emitting pattern EL. The second electrode E2 may be arranged to face the first electrode E1. The second electrode E2 may be connected to a power terminal and may receive a power voltage. The organic light emitting device OLED may receive a second power voltage ELVSS (e.g., see FIG. 3B), which is different from the first power voltage ELVDD (e.g., see FIG. 3B), through the second electrode E2.

The second electrode E2 may be overlapped with a plurality of light-emitting patterns EL. For example, the second electrode E2 may be arranged on (or extend across) the entire top surface of the pixel definition layer PDL to cover the pixel definition layer PDL and the light-emitting patterns EL, which are exposed through openings defined in the pixel definition layer PDL.

Accordingly, the first electrode E1, the light-emitting pattern EL, and a portion of the second electrode E2 corresponding to the light-emitting pattern EL may be sequentially stacked in the third direction D3. However, embodiments according to the inventive concept are not limited to this example or a specific embodiment. For example, according to some example embodiments, the second electrode E2 may include a plurality of patterns, which are locally located on the light-emitting patterns EL, respectively.

The second electrode E2 may be formed of or include a transparent conductive material or a transflective conductive material. Thus, light generated by the light-emitting pattern EL may easily pass through the second electrode E2 and may propagate in the third direction D3. However, embodiments according to the inventive concept are not limited to this example or a specific embodiment, and in an embodiment, the organic light emitting device OLED may be designed to have a back-sided emission structure, in which the first electrode E1 includes a transparent or transflective material, or a double-sided emission structure, which is configured to allow light to be emitted through both of the front and rear surfaces thereof.

Meanwhile, according to some example embodiments, the organic light emitting device OLED may further include at least one organic layer or at least one inorganic layer, which is located in at least one of the regions between the light-emitting pattern EL and the first electrode E1 and between the light-emitting pattern EL and the second electrode E2. The organic or inorganic layer may be used to control the flow of electric charges, which are supplied from the first electrode E1 and the second electrode E2 to the light-emitting pattern EL, and this may make it possible to improve optical efficiency and lifespan of the organic light emitting device OLED.

The encapsulation layer TFE may be located on the display device layer EDL. The encapsulation layer TFE may be located on the organic light emitting device OLED to encapsulate the organic light emitting device OLED. According to some example embodiments, a capping layer may be further located between the second electrode E2 and the encapsulation layer TFE to cover the second electrode E2.

The encapsulation layer TFE may include a first inorganic layer IOL1, an organic layer OL, and a second inorganic layer IOL2, which are sequentially stacked in the third direction D3. However, embodiments according to the inventive concept are not limited to this example, and the encapsulation layer TFE may further include a plurality of inorganic layers and a plurality of organic layers.

The first inorganic layer IOL1 may cover the second electrode E2. The first inorganic layer IOL1 may prevent external moisture or oxygen from entering the organic light emitting device OLED. For example, the first inorganic layer IOL1 may include at least one of silicon nitride, silicon oxide, silicon oxynitride, and compounds thereof. The first inorganic layer IOL1 may be formed through a deposition process.

The organic layer OL may be located on the first inorganic layer IOL1 and may be in contact with the first inorganic layer IOL1. The organic layer OL may have a relatively flat top surface, compared to the first inorganic layer IOL1 thereunder. Because an uneven structure, particles, or the like, which are present on the first inorganic layer IOL1, are covered by the organic layer OL, it may be possible to prevent elements on the organic layer OL from being affected by the uneven profile of the top surface of the first inorganic layer IOL1. In addition, the organic layer OL may relieve stress between layers that are in contact with each other. The organic layer OL may include an organic material and may be formed by a solution process, such as a spin coating process, a slit coating process, and an inkjet process.

The second inorganic layer IOL2 may be located on the organic layer OL to cover the organic layer OL. By virtue of the organic layer OL having a relatively flat top surface, it may be possible to more stably form the second inorganic layer IOL2, compared to the case that the second inorganic layer IOL2 is directly formed on the first inorganic layer IOL1. The second inorganic layer IOL2 may encapsulate the organic layer OL and prevent moisture from being leaked from the outside to the organic layer OL. The second inorganic layer IOL2 may include at least one of silicon nitride, silicon oxide, silicon oxynitride, and compounds thereof. The second inorganic layer IOL2 may be formed by a deposition process.

According to some example embodiments, the encapsulation layer TFE may include a glass substrate. Here, the encapsulation layer TFE may be coupled to the base substrate SUB by a frit seal. According to some example embodiments, if the encapsulation layer TFE can be used to encapsulate or seal the organic light emitting device OLED, the shape of the encapsulation layer TFE may be variously changed, and embodiments according to the inventive concept are not limited to a specific embodiment.

The input sensing unit TU-A may be directly arranged on the encapsulation layer TFE. FIG. 16B illustrates an example of some of the first sensing electrodes TE1 and the strain sensing patterns FS, which are included in the input sensing unit TU-A and the pressure sensing sensor FPS, respectively.

The first connection patterns BP1 and the strain sensing patterns FS may be located on the encapsulation layer TFE. The first connection patterns BP1 and the strain sensing patterns FS may be overlapped with the non-light-emitting region NPXL. When viewed in a sectional view, an end portion of the first connection pattern BP1 and an end portion of the strain sensing pattern FS facing each other may be defined as a mesh opening MSL-OP. The mesh opening MSL-OP may correspond to one of the mesh openings MSL-OP1, MSL-OP2, MSL-OP3, and MSL-OP4 described with reference to FIG. 6. Because the mesh opening MSL-OP is overlapped with the light-emitting region PXL, light provided from the display unit DU-A may be transferred, without interference with the input sensing unit TU-A and the pressure sensing sensor FPS.

According to some example embodiments of the inventive concept, at least a portion of the sub-strain sensing pattern SGP located in the display circuit layer CL may be overlapped with the strain sensing pattern FS located on the encapsulation layer TFE. According to some example embodiments, because the display module DM-A includes the pressure sensing sensor FPS and the sub-pressure sensing sensor SSP located in the input sensing unit TU-A and the display unit DU-A, respectively, it may be possible to realize the display module DM-A, which is configured more precisely sense a change in resistance caused by pressure.

According to some example embodiments of the inventive concept, because a pressure sensing sensor is located in an input sensing unit, it may be possible to provide an electronic device including the pressure sensing sensor, which is configured to more precisely sense a change in resistance caused by pressure.

While example embodiments of the inventive concepts have been particularly shown and described, it will be understood by one of ordinary skill in the art that variations in form and detail may be made therein without departing from the spirit and scope of the claims, and their equivalents.

What is claimed is:

1. An electronic device, comprising:
    a base substrate including an active region, which includes a sensing region, and a peripheral region adjacent to the active region;
    an input sensor comprising a plurality of first sensing electrodes, a plurality of second sensing electrodes, which are on the base substrate, the second sensing electrodes being spaced apart from the first sensing electrodes, and a plurality of dummy patterns spaced apart from the first sensing electrodes and the second sensing electrodes; and
    a pressure sensor comprising a plurality of strain sensing patterns overlapping the sensing region, and a plurality of strain connection patterns connecting the strain sensing patterns to each other,
    wherein the strain sensing patterns and the dummy patterns are at a same layer, and
    wherein the strain sensing patterns are spaced apart from the first sensing electrodes and the second sensing electrodes when viewed in a plan view.

2. The electronic device of claim 1, wherein each of the first sensing electrodes comprises a plurality of first sensing patterns overlapping the active region, and a plurality of first connection patterns connecting the first sensing patterns,
    each of the second sensing electrodes comprises a plurality of second sensing patterns overlapping the active region, and a plurality of second connection patterns connecting the second sensing patterns,
    the first sensing patterns and the second sensing patterns are located on a sensing insulating layer.

3. The electronic device of claim 2, wherein the dummy patterns and the first connection patterns are at a same layer.

4. The electronic device of claim 2, wherein the strain sensing patterns are enclosed by at least one of the first sensing patterns or the second sensing patterns when viewed in a plan view.

5. The electronic device of claim 2, wherein the dummy patterns are enclosed by at least one of the first sensing patterns or the second sensing patterns when viewed in a plan view,
    wherein the dummy patterns are spaced apart from the strain sensing patterns.

6. The electronic device of claim 5, wherein at least one of the dummy patterns is enclosed by at least one of the strain sensing patterns.

7. The electronic device of claim 2, further comprising a temperature sensing sensor comprising temperature sensing patterns and temperature connection patterns connecting the temperature sensing patterns,
    wherein the temperature sensing patterns are at a same layer as the strain sensing patterns, are enclosed by at least one of the first sensing patterns or the second sensing patterns when viewed in a plan view, and are spaced apart from the dummy patterns and the strain sensing patterns.

8. The electronic device of claim 2, further comprising sub-dummy patterns at a same layer as the first sensing patterns and overlapping the strain sensing patterns,
    wherein each of the sub-dummy patterns is enclosed by at least one of the first sensing patterns or the second sensing patterns when viewed in a plan view.

9. The electronic device of claim 8, wherein each of the strain sensing patterns overlaps at least one of the first sensing patterns or the second sensing patterns when viewed in a plan view.

10. The electronic device of claim 2, wherein the pressure sensor further comprises auxiliary strain sensing patterns,
wherein the input sensor further comprises a sensing insulating layer located between the auxiliary strain sensing patterns and the strain sensing patterns,
wherein the auxiliary strain sensing patterns is connected to the strain sensing patterns via a contact hole through the sensing insulating layer, and
wherein the auxiliary strain sensing patterns are enclosed by at least one of the first sensing patterns or the second sensing patterns when viewed in a plan view.

11. The electronic device of claim 2, wherein the sensing region further comprises a home button region enclosed by a border between the active region and the sensing region and has a closed-line shape, and
wherein a width of the strain connection patterns overlapped with the home button region is larger than a width of each of the first and second sensing patterns, when measured in a specific direction in a sectional view.

12. The electronic device of claim 1, wherein the strain sensing patterns comprise mesh lines.

13. The electronic device of claim 12, further comprising:
a display circuit layer comprising a transistor between the base substrate and the input sensor, the transistor comprising a semiconductor pattern and a light blocking pattern on the base substrate and overlapping the semiconductor pattern; and
a display unit comprising a display device layer, which comprises a first electrode connected to the transistor, a second electrode opposite to the first electrode, and a light-emitting pattern between the first electrode and the second electrode,
wherein the light-emitting pattern is spaced apart from the mesh lines when viewed in a plan view.

14. The electronic device of claim 13, further comprising a sub-pressure sensing sensor comprising a sub-strain sensing pattern at a same layer as the light blocking pattern, and a sub-strain sensing line connected to the sub-strain sensing pattern,
wherein the sub-strain sensing pattern overlaps at least one of the strain sensing patterns.

15. The electronic device of claim 1, wherein the strain connection patterns and the strain sensing patterns are at a same layer.

16. The electronic device of claim 1, wherein each of the strain sensing patterns is linear.

17. The electronic device of claim 16, wherein the pressure sensor comprises:
a first strain line in the peripheral region and connected to an end of one of the strain connection patterns; and
a second strain line in the peripheral region and connected to an end of another one of the strain connection patterns,
wherein the first strain line and the second strain line are configured to receive signals that are different from each other.

18. An electronic device, comprising:
a sensing insulating layer; and
a first conductive layer and a second conductive layer spaced apart from each other, with the sensing insulating layer interposed therebetween,
wherein the first conductive layer comprises a pressure sensing sensor, which comprises a first connection pattern, a dummy pattern, a strain sensing pattern spaced apart from the first connection pattern and the dummy pattern, and a strain connection pattern connected to the strain sensing pattern,
wherein the second conductive layer comprises a first sensing pattern connected to the first connection pattern through the sensing insulating layer, a second sensing pattern spaced apart from the first sensing pattern, and a second connection pattern connected to the second sensing pattern,
wherein the strain sensing pattern is spaced apart from the first sensing pattern and the second sensing pattern when viewed in a plan view, and
wherein the strain sensing pattern is enclosed by at least one of the first sensing pattern or the second sensing pattern when viewed in a plan view.

19. The electronic device of claim 18, wherein the dummy pattern is enclosed by at least one of the first sensing pattern or the second sensing pattern when viewed in a plan view.

20. The electronic device of claim 19, wherein the dummy pattern is enclosed by the strain sensing pattern.

21. The electronic device of claim 18, wherein the first conductive layer is below the sensing insulating layer, and the second conductive layer is on the sensing insulating layer.

22. The electronic device of claim 18, wherein the second conductive layer further comprises a sub-dummy pattern, which is overlapped with the strain sensing pattern and is enclosed by at least one of the first sensing pattern or the second sensing pattern when viewed in a plan view.

23. The electronic device of claim 18, wherein the first conductive layer and the second conductive layer comprise mesh lines.

24. The electronic device of claim 18, wherein the first connection pattern, the second connection pattern, and the strain connection pattern are spaced apart from each other when viewed in a plan view.

25. The electronic device of claim 18, wherein the first conductive layer further comprises a temperature sensing pattern, which is enclosed by one of the first sensing pattern or the second sensing pattern when viewed in a plan view, and a temperature connection pattern, which is connected to the temperature sensing pattern, and
wherein the temperature sensing pattern is spaced apart from the strain sensing pattern and the dummy pattern.

* * * * *